(12) United States Patent
James et al.

(10) Patent No.: US 7,117,301 B1
(45) Date of Patent: Oct. 3, 2006

(54) PACKET BASED COMMUNICATION FOR CONTENT ADDRESSABLE MEMORY (CAM) DEVICES AND SYSTEMS

(75) Inventors: David V. James, Palo Alto, CA (US); Jagadeesan Rajamanickam, San Jose, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 452 days.

(21) Appl. No.: 10/329,246

(22) Filed: Dec. 23, 2002

Related U.S. Application Data

(60) Provisional application No. 60/343,973, filed on Dec. 27, 2001.

(51) Int. Cl.
*G06F 12/00* (2006.01)

(52) U.S. Cl. ..................................... 711/108
(58) Field of Classification Search ............... 711/108; 365/49; 370/386, 392
See application file for complete search history.

(56) References Cited

U.S. PATENT DOCUMENTS

| | | | |
|---|---|---|---|
| 5,745,488 A | | 4/1998 | Thompson et al. |
| 5,764,895 A | | 6/1998 | Chung |
| 5,926,626 A | | 7/1999 | Takeuchi et al. |
| 5,930,359 A | | 7/1999 | Kempke et al. |
| 5,963,450 A | * | 10/1999 | Dew .......................... 700/169 |
| 6,148,364 A | | 11/2000 | Srinivasan et al. |
| 6,151,640 A | * | 11/2000 | Buda et al. .................... 710/11 |
| 6,173,333 B1 | | 1/2001 | Jolitz et al. |
| 6,240,485 B1 | | 5/2001 | Srinivasan et al. |
| 6,252,872 B1 | | 6/2001 | Tzeng |
| 6,307,855 B1 | * | 10/2001 | Hariguchi ..................... 370/392 |
| 6,317,350 B1 | | 11/2001 | Pereira et al. |
| 6,366,761 B1 | * | 4/2002 | Montpetit .................. 455/12.1 |
| 6,606,681 B1 | * | 8/2003 | Uzun .......................... 711/108 |
| 6,763,426 B1 | * | 7/2004 | James et al. ................. 711/108 |
| 6,826,191 B1 | * | 11/2004 | Jones et al. .................. 370/401 |
| 6,876,558 B1 | * | 4/2005 | James et al. ................... 365/49 |
| 2002/0023080 A1 | * | 2/2002 | Uga et al. ....................... 707/1 |
| 2002/0122411 A1 | * | 9/2002 | Zimmerman et al. ........ 370/349 |
| 2002/0126672 A1 | * | 9/2002 | Chow et al. .................. 370/392 |
| 2002/0181454 A1 | * | 12/2002 | Norman et al. .............. 370/386 |
| 2003/0009618 A1 | * | 1/2003 | Regev et al. ................ 711/108 |
| 2004/0059822 A1 | * | 3/2004 | Jiang et al. .................. 709/230 |

OTHER PUBLICATIONS

U.S. Appl. No. 10/024,609, not published, James et al.
U.S. Appl. No. 10/264,684, not published, James et al.
"IEEE Standard for Scalable Coherent Interface (SCI)", *IEEE Std 1596-1992*, Institute of Electrical and Electronic Engineers, Inc., New York, NY, pp. 4-25 and 47-72, May 23, 2001.
"MUAA™ CAM Family", Music Semiconductors, Feb. 24, 1988.
"MU9C1480 LANCAM", Music Semiconductors, Mar. 22, 1990.
"Am99C10A 256×48 Content Addressable Memory", Advanced Micro Devices, Dec. 1992.

* cited by examiner

*Primary Examiner*—Hiep T. Nguyen
(74) *Attorney, Agent, or Firm*—Bradley T. Sako

(57) ABSTRACT

A search engine system (100) and CAM device (300) are disclosed. A search engine system (100) may generate response packets (112) in response to requests packets (110) and include at least one content addressable memory (CAM) device (102-0) having an input interface (116-0) for receiving data packets and an output interface (116-1) for transmitting data packets.

18 Claims, 13 Drawing Sheets

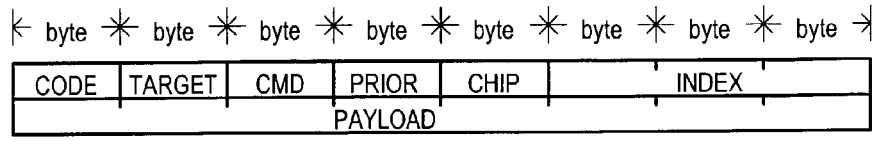

FIG. 2D

| CMD | OPERATION | NAME |
|---|---|---|
| 0X | Search beyond entry, at lower priorities, return index value | EXPLORE_KEY_INDEX_LE |
| 1X | Search beyond entry, at selected priority, return index value | EXPLORE_KEY_INDEX_EQ |
| 2X | Search beyond entry, at lower priorities, return tag data | EXPLORE_KEY_TAG_LE |
| 3X | Search beyond entry, at selected priority, return tag data | EXPLORE_KEY_TAG_EQ |
| 4X | Search with key, at lower priorities, return index value | SEARCH_KEY_INDEX_LE |
| 5X | Search with key, at selected priority, return index value | SEARCH_KEY_INDEX_EQ |
| 6X | Search with key, at lower priorities, return tag data | SEARCH_KEY_TAG_LE |
| 7X | Search with key, at selected priority, return tag data | SEARCH_KEY_TAG_EQ |
| 8X | Write key value to CAM entry | WRITE_KEY |
| 9X | Write mask value to CAM entry | WRITE_MASK |
| AX | Multicast Write of key value to CAM entries | MCAST_KEY |
| BX | Multicast Write of mask value to CAM entries | MCAST_MASK |
| CX-EX | Reserved | |
| F0 | Read key value from CAM entry | READ_KEY |
| F1 | Read mask value from CAM entry | READ_MASK |
| F2 | Read configuration register value | READ_CREG |
| F3 | Read block control register | READ_BREG |
| F4 | Write configuration register value | WRITE_CREG |
| F5 | Write block control register | WRITE_BREG |
| F6 | Multicast Write of configuration registers | BCAST_CREG |
| F7 | Multicast Write of block control registers | MCAST_BREG |
| F8-FD | Reserved | |
| FE | Assign Chip ID Value | ASSIGN_ID |
| FF | Reset Chip ID Value | RESET_IDS |

FIG. 2E

| STAT | NAME | DESCRIPTION |
|---|---|---|
| 0 | MATCH1 | HIT - SINGLE MATCHING ENTRY |
| 1 | ENTRY1 | MISS - SINGLE FREE ENTRY |
| 2 | SBLOCK1 | MISS - SINGLE FREE SUB-BLOCK |
| 3 | BLOCK1 | MISS - SINGLE FREE BLOCK |
| 4 | FULL | MISS - NO FREE ENTRIES |
| 5 | RESERVED | RES |
| 6 | RESERVED | RES |
| 7 | RESERVED | RES |
| 8 | MATCH2 | HIT -- MATCHING ENTRIES |
| 9 | ENTRY2 | MISS -- FREE ENTRIES |
| A | SBLOCK2 | MISS - FREE SUB-BLOCKS |
| B | BLOCK2 | MISS - FREE BLOCKS |
| C | RESERVED | RES |
| D | RESERVED | RES |
| E | RESERVED | RES |
| F | RESERVED | RES |

FIG. 2F

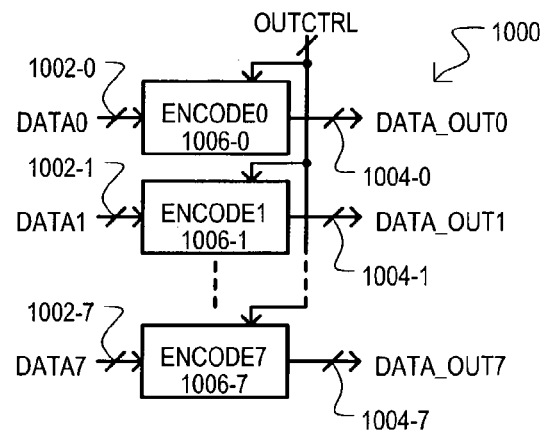
FIG. 10A
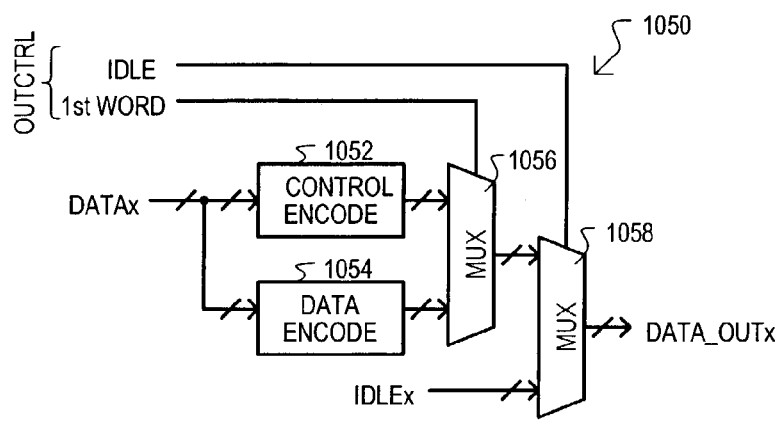
FIG. 10B
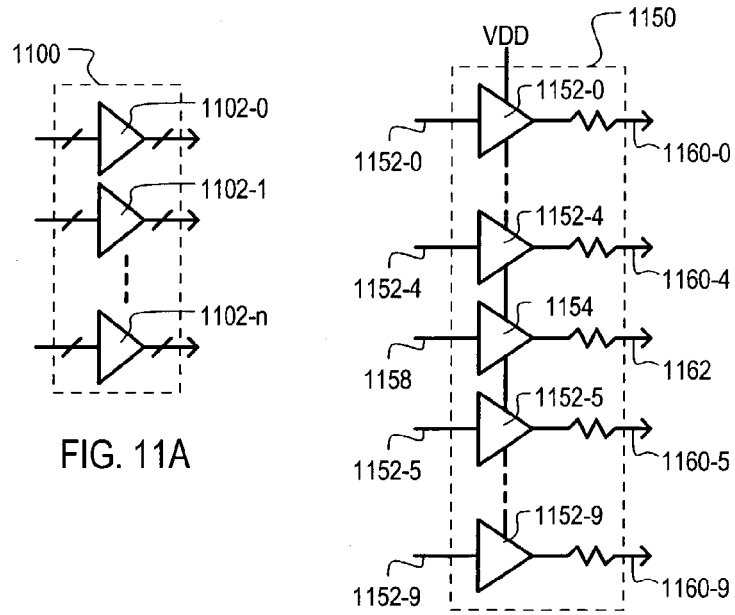
FIG. 11A
FIG. 11B

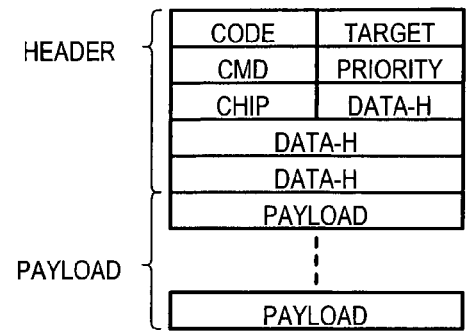
FIG. 12A
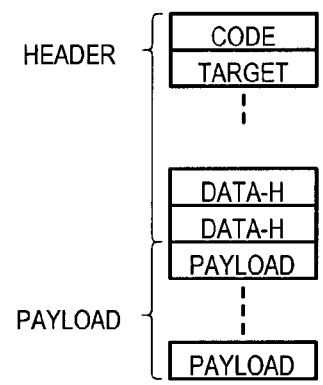
FIG. 12B
FIG. 12C
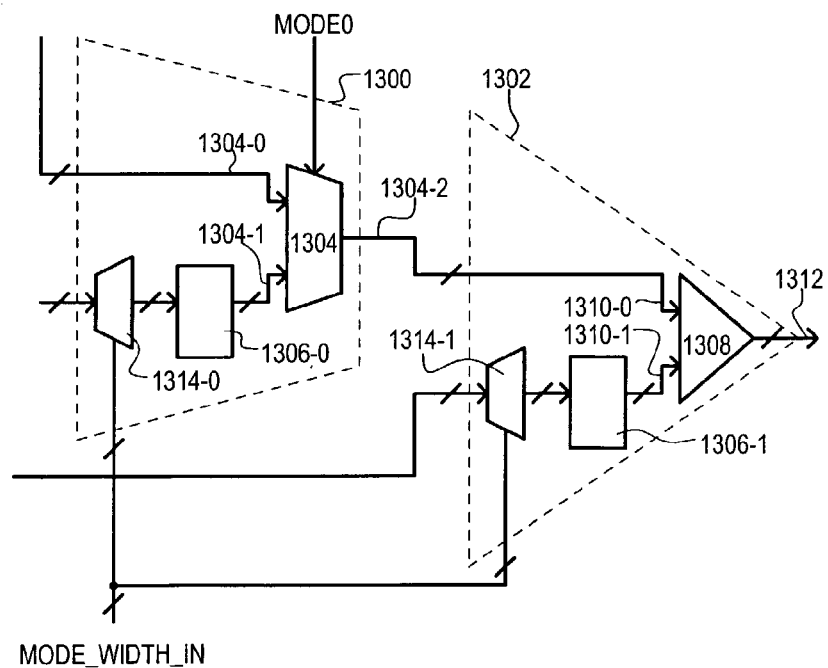
FIG. 13

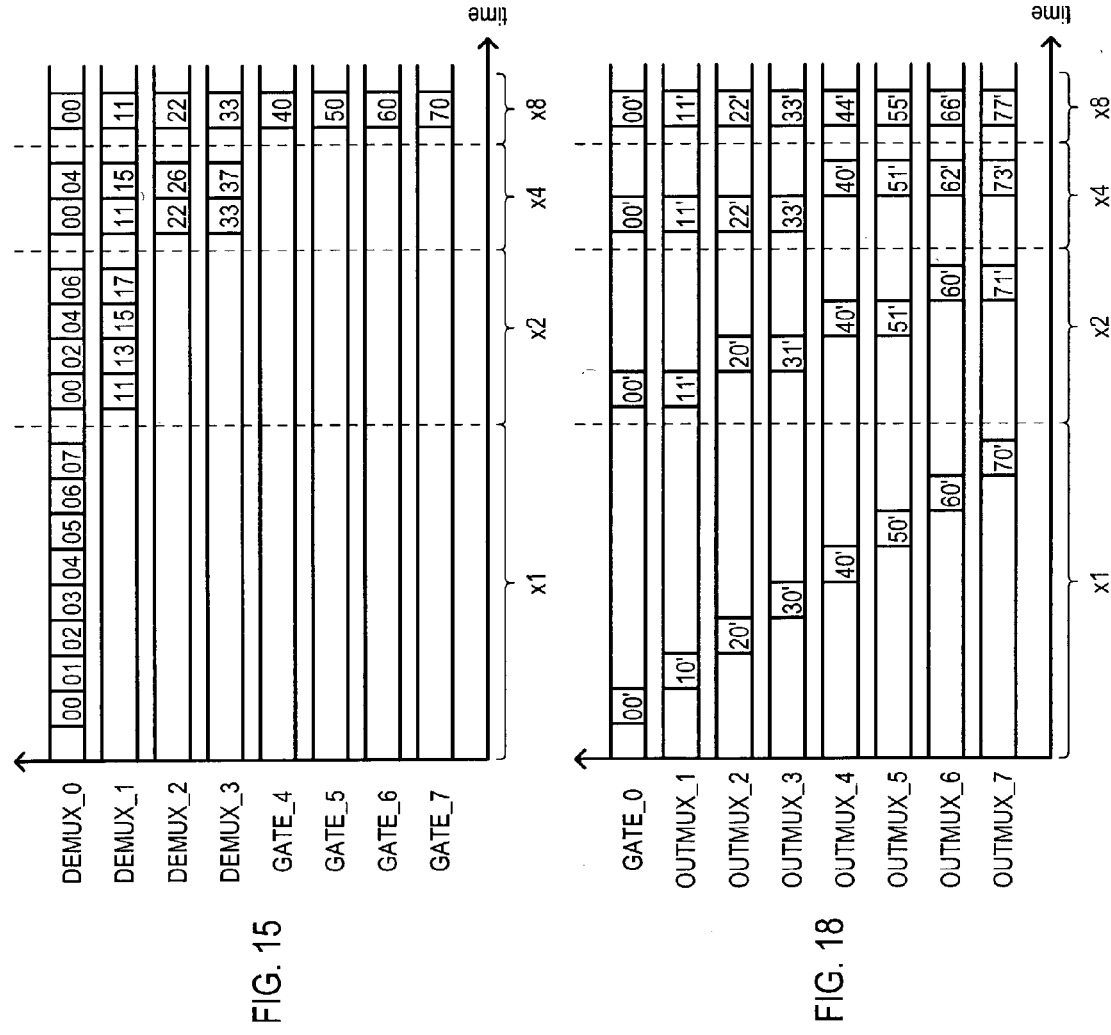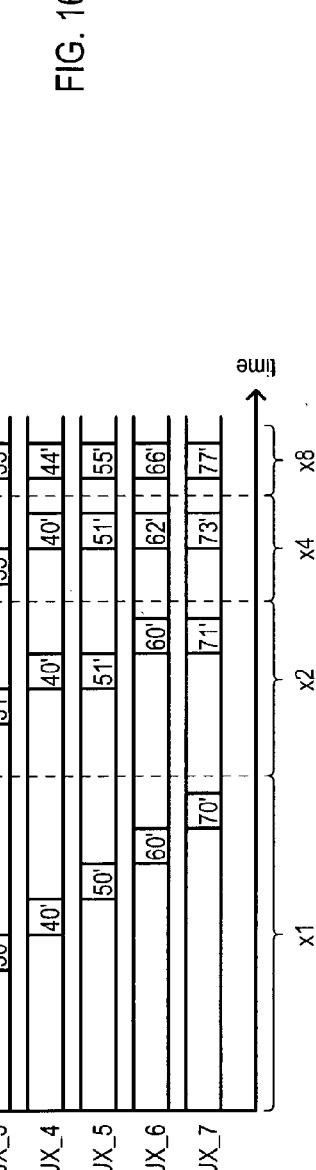
FIG. 16
FIG. 15
FIG. 18

PACKET BASED COMMUNICATION FOR CONTENT ADDRESSABLE MEMORY (CAM) DEVICES AND SYSTEMS

This application claims the benefit of provisional application Ser. No. 60/343,973 filed Dec. 27, 2001.

TECHNICAL FIELD

The present invention relates generally to content addressable memory (CAM) devices and systems, and more particularly to methods of providing command data to and receiving data from such devices and systems.

BACKGROUND OF THE INVENTION

Search engine systems typically perform a search operation that can compare a search key value (e.g., a comparand) against a number of other data values. In the event a search key value matches a data value, a search key result may be considered a "hit" (e.g., match). If a search key value does not match any data values, a search result may be considered a "miss" (e.g., no match). Search engine systems continue to gain prevalence in networking hardware, and the like, as packet processing can require rapid matching of header fields to various tables in order to execute various functions on data packets. Such functions can include packet forwarding, filtering, or other types of processing.

While search engines can be based on a general-purpose processor and an accompanying algorithm, such approaches may be undesirably costly or slower in speed when compared to systems based on devices that may specialize in more rapid matching capabilities. One such device is a content addressable memory (CAM) device.

A CAM based search engine can typically include one or more CAM devices. A CAM device may include a number of entries, each of which may store a data value, or portion thereof. In a search operation, a comparand (or key) may be compared to multiple entries to see if all, or a portion, of the key matches an entry. After a search operation, a CAM device may give a search result as an output. Typically a search result may provide associated data directly, or can provide an "index" value that may be used to retrieve associated data from another device, such as a random access memory (RAM).

CAM devices may take a variety of forms. As but a few of the possible examples, a CAM device may be based on particular types of CAM cells. Such cells may include storage circuits integrated with compare circuits. Examples of storage circuits may be static random access memory (SRAM) type cells or dynamic random access memory (DRAM) type cells. Alternate approaches may include random access memories (RAM) arrays, or the like, with separate matching circuits and/or processing circuits.

A conventional CAM device and CAM based search engine device will now be described.

Referring to FIG. 19, a conventional CAM based device is set forth in a block diagram and designated by the general reference character 1900. A CAM device 1900 may include CAM entries 1902, an address decoder 1904, a compare data portion 1906, and a priority encoder 1908. CAM entries 1902 may store data values for comparison with a search key value. Address decoder 1904 may decode address values to provide access to CAM entries 1902. Compare data portion 1906 may apply search key values to CAM entries 1902. Priority encoder 1908 may prioritize match indications from CAM entries 1902, and encode a highest priority match entry into an index value.

The conventional CAM of FIG. 19 also includes a buffer 1910 and a command decoder 1912. A buffer 1910 may receive and output data values. In particular, a buffer 1910 may receive data values to be written into CAM entries 1902, search key values for application to CAM entries 1902, and output data values read from CAM entries 1902. A command decoder 1912 may receive command values and generate control signals from such command values for executing predetermined operations within CAM device 1900.

A conventional CAM device 1900 can also include dedicated input/outputs (I/Os) 1914-0, 1914-1 and 1914-2. Dedicated I/Os (1914-0, 1914-1 and 1914-2) may receive only predetermined values. Thus, in FIG. 19, dedicated I/Os 1914-0 may receive only address data or entry data, and may provide entry data. Similarly, dedicated I/Os 1914-1 may only receive command data, while dedicated I/Os 1914-2 may only provide index values. In a packaged CAM device, dedicated I/Os (1914-0, 1914-1 and 1914-2) can correspond to conductive leads of a package.

It is noted that conventional CAM devices may also include a RAM interface, or the like, for receiving index values. A RAM interface may generate address and control signals for a RAM device to thereby access data associated with a given index value.

A conventional CAM-based search engine system will now be described with reference to FIG. 20. The conventional CAM-based search engine system 2000 shown in FIG. 20 includes a command issuing device ("host") 2002, a CAM device 2004, and a RAM device 2006. A command issuing device 2002 may provide command and search data to dedicated I/Os of a CAM device 2004. In response to such command and search data, a CAM device 2004 can generate index values. Such index values can be received by a RAM interface within a CAM device 2004, which can generate memory address and control signals ADD/CTRL in response thereto. Memory address and control signals ADD/CTRL may be received on dedicated I/Os of a RAM device 2006. From such memory address and control signals, a RAM device 2006 may provide associated data to a data bus 2008.

While conventional CAM devices and CAM-based search engines can typically provide a fast rate of search relative to processor systems, it is always a desirable goal to provide faster search rates.

It is also noted that the conventional CAM-based search engine system of FIG. 20 shows a system with relatively few components. However, as such systems scale up in size, there may be increased wiring and/or operational complexity. In particular, many CAM devices and/or RAM devices may operate according to some kind of enabling signal, or the like. For example, a CAM device may identify command data according to a command valid signal, or the like. Similarly, a RAM device can be enabled by a chip select signal, or the like. As component numbers are increased, the number of signal lines that carry such enabling signal can increase. Further, it can become increasingly difficult to match signal line impedances with respect to a host device. Consequently, a host may have to accommodate different timings between different devices.

In light of the above, it would be desirable to arrive at some way of increasing overall search rates for a CAM-based search engine relative to conventional approaches. In addition, or alternatively, it would be desirable to arrive at a CAM device configuration that results in more simplified wiring as the number of CAM devices in such a system is increased.

SUMMARY OF THE INVENTION

According to the present invention, a content addressable memory (CAM) device may include a depacketizing section that receives data packets on at least one input data lane. A data lane can include a plurality of conductive lines. A depacketizing section can extract command data from received data packets. A CAM device may also include a CAM core that can execute search functions in response to command data extracted from the received data packets.

According to one aspect of the embodiments, a CAM device depacketizing section may include one or more receiver circuits. Each receiver circuit can be coupled to at least one input data lane, and an amplify data signals on the data lane to generate character data.

According to another aspect of the embodiments, a CAM device may also include a packetizing section that can receive result data from a CAM core. A packetizing section can output result data in a predetermined packet format on at least one output data lane. An output data lane can include a number of conductive lines.

According to another aspect of the embodiments, a CAM device packetizing section can include one or more transmit circuits. Each transmit circuit can be coupled to the at least one output data lane, and can drive conductive lines of an output data lane according to packet data.

According to another aspect of the embodiments, a CAM device packetizing section can output data in the packet format on multiple data lanes essentially simultaneously.

The present invention may also include a method having the steps of receiving a request in data packet form at a plurality of CAM device inputs, extracting command information from the data packet, and executing predetermined CAM operation in response to the command information.

According to one aspect of the embodiments, predetermined CAM operations can be selected from search-type operations that can compare a search key value to CAM entry values, write-type operations that can write data values to predetermined locations in a CAM device, and read-type operations that can read data values from predetermined locations of a CAM device.

According to another aspect of the embodiments, a step of extracting command information can include storing command information in a memory circuit.

According to another aspect of the embodiments, a method may also include outputting result data generated in response to a request. Such result data may be output in data packet form at a plurality of CAM device outputs. Such CAM device outputs can be different than CAM device inputs.

According to another aspect of the embodiments, a method may also include outputting a received request in data packet form at a number of CAM device outputs, different from CAM device inputs.

The present invention may also include a CAM system with at least one interface configured to send or to receive data packets.

According to one aspect of the embodiments, such a data packet can include a target field that stores a destination indication for the packet. In particular arrangements, such a target indication can be no more than 8 bits.

According to another aspect of the embodiments, data packets sent or received by a CAM system can include request data packets received by a CAM system and response packets transmitted from a CAM system.

According to another aspect of the embodiments, data packets sent or received by a CAM system can include a status field that stores a status indication for a search result of a CAM system. A status indication can show a result selected from the group consisting of: indicating a match between a search key value and at least one entry in the CAM system, indicating no match between a search key value and entries in the CAM system, indicating multiple matches between a search key value and entries in the CAM system, indicating an entry is free within the CAM system, indicating a block of entries is free within the CAM system, indicating a sub-block of entries is free within the CAM system.

According to another aspect of the embodiments, a data packet can include a command field that stores a command for execution by at least one device within the CAM system.

According to another aspect of the embodiments, a data packet can include a priority field that stores a priority value for search in the CAM system.

According to another aspect of the embodiments, a data packet can include a chip identification field that stores a chip id value corresponding to a device within the CAM system.

According to another aspect of the embodiments, a data packet can a data field that stores a search key value for comparison with entries in the CAM system.

BRIEF DESCRIPTION OF THE DRAWINGS

FIGS. 2A–2D are block diagrams of data packets according to various embodiments of the present invention.

FIGS. 2E and 2F are tables showing various packet field values according to embodiments of the present invention.

FIG. 10A is a block diagram of a packet output circuit according to an embodiment.

FIG. 10B is a block schematic diagram of an encoding circuit according to an embodiment.

FIG. 11A is a schematic diagram of transmit circuits according to an embodiment.

FIG. 11B is a schematic diagram of a lane transmit circuit according to an embodiment.

FIGS. 12A to 12C are block diagrams showing packets transmitted at less than a "word" width.

FIG. 13 is a block schematic diagram of a first mode multiplexer and first voting section for accommodating variable width packet data.

FIG. 15 is a timing diagram showing the operation of the input de-multiplexer of FIG. 14.

FIG. 16 is block schematic diagram of a second voting section for accommodating variable packet width data.

FIG. 18 is a timing diagram showing the operation of the output de-multiplexer of FIG. 17.

DETAILED DESCRIPTION OF THE EMBODIMENTS

Various embodiments will now be described in conjunction with a number of diagrams. The embodiments set forth content addressable memory (CAM) devices, CAM-based systems, and methods by which communication with CAM devices can be via data packets.

Figure 1:
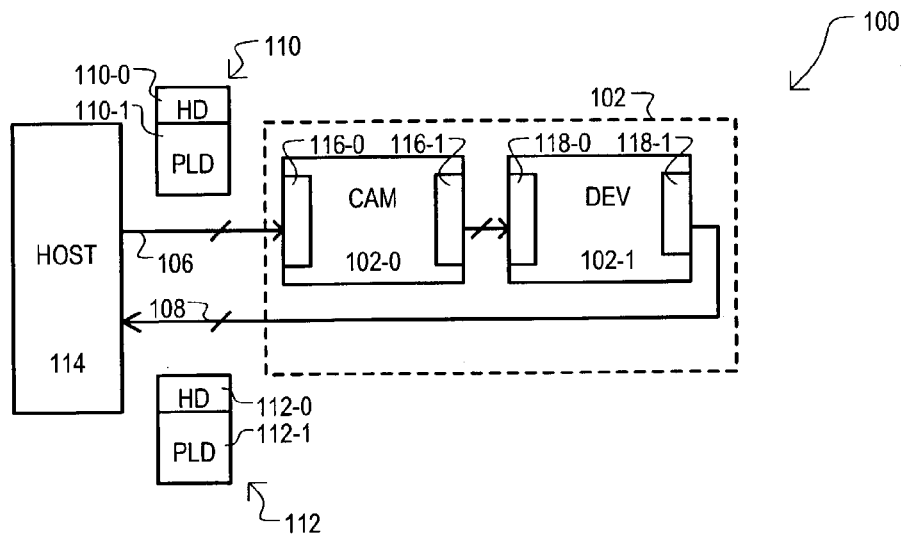
FIG. 1 is a block diagram of a content addressable memory (CAM) system, according to one embodiment of the present invention.

Referring now to FIG. 1, a search engine system according to one embodiment is set forth in block diagram form and designated by the general reference character 100. A search engine system 100 may include a number of connected integrated circuit devices 102-0 and 102-1, at least one of which can be a CAM device 102-0. Input data for a system 100 may be received via input communication links 106, and output data for a system 100 may be provided via output communication links 108.

In the example shown, a system 100 may receive input data from, and provide output data to, a request issuing device (e.g., a "host") 114.

Unlike conventional CAM devices, that may include address, data or control input dedicated to particular signal types, devices (102-0 and 102-1) may receive input data and provide output data in packet form. Thus, a search engine system 100 may receive requests packets (one of which is shown as 110) and return response packets (one of which is shown as 112).

A CAM device 102-0 may include a number of entries and may perform CAM related operations. CAM related operations may include, but are not limited to search-type, read-type, and write-type operations, described in more detail below. A search-type operation can include comparison of a search key value to data values stored in CAM entries of a CAM device 102-0. In a search-type operation, a CAM device 102-0 may receive search key value from a request issuing device 114.

A search key value may be transmitted to a CAM device 102-0 via input communication links 106. A search key value may be included as a predetermined field within a request packet 110. After such a request packet 110 is received by a CAM device 102-0, a search key value can be compared to data values stored within a number of CAM entries. A CAM device 102-0 may then generate a search result as output data. Such output data may be transmitted to another device 102-1 in a system 100.

Input communication links 106 may connect a requesting device 114 to devices in a system 100. In the example of FIG. 1, input communication links 106 can connect requesting device 114 to a CAM device 102-0. Input communication links 106 may include a point-to-point connection from a requesting device (such as a host device) 114 to a first device in a CAM-based system (in this case CAM device 102-0). A point-to-point connection can preferably include a number of conductive lines that provide a one-way communication path for data signals transmitted in predetermined packet format.

It is noted that a CAM device 102-0 can preferably be formed on a single integrated circuit substrate. Thus, a CAM device 102-0 can be single integrated circuit that can receive request data in packet form, extract data from such a packet with circuits on a same substrate as those of CAM entries.

It is further understood that a system 100 may include more than two devices 102-0 to 102-1. As but two examples, such other devices 102-1 may include one or more other CAM devices and/or one or more random access memory (RAM) devices.

Because a system may transmit data between devices in packet format, a CAM device 102-0 and other devices 102-1 of a system 100 may include interfaces for receiving request and response data in packet form, and outputting such data in packet form. Accordingly, a CAM device 102-0 may include an input interface 116-0 and an output interface 116-1. Similarly, another device 102-1 can have an input interface 118-0 and an output interface 118-1. Input interfaces (116-0 and 118-0) can receive request packets, and convert such data packets into command information for a device (102-0 and 102-1). Output interfaces (116-1 and 118-1) can convert result data generated by a device (102-0 and 102-1) into a response packet.

Referring still to FIG. 1, a request packet 110 can include data values in a predetermined format. An example of a predetermined format can include a header (HD) 110-0, and optionally, a payload (PLD) 110-1. In one very particular approach, a header 110-0 can include a start value to indicate the start of a data packet, a size value to indicate the size of a data packet, and/or an operation type data value to indicate a type of a request that is to be executed. A header 110-0 may precede a payload 110-1 in a transmission order. A request packet payload 110-1 may include data values related to a request that is to be executed.

It is noted that a data packet can be directly received by a CAM device 102-0 without any intermediate processing by some other device. Thus, the CAM device 102-0 itself includes a packet processing interface, in contrast to conventional CAM devices like those described above.

It is also noted that a CAM device 102-0 may pass on received request packets to other devices in a system. Thus, in addition to generating and providing response packets, a CAM device 102-0 may also "pass on" received request packets.

In one approach, other devices 102-1 of a system 100 (e.g., other CAM devices or RAM devices) may also receive request packets and provide response packets. For example, in the case a device 102-1 is another CAM device, such another CAM device can receive a request packet passed on by a CAM device 102-0, and process such a request packet in a similar fashion. Further, such another device 102-1 may also pass on such a request device to other devices in a system. Still further, if another device 102-1 is a CAM device, such another device can compare a response generated from previous CAM device 102-0 to its own generated response, and from such multiple responses generate an output response packet.

Output communication links 108 may connect a last device of a system to a requesting device 114. Similar to input communication links 106, output communication links 108 can also be a point-to-point connection from a last device in a CAM-based system 100 to a requesting device 114.

A last device 102-1 of a CAM-based system 100, can output a response packet. A response packet may include, for example, match result data generated from a search request. A response packet 112 can include data values in a predetermined format. Like a request packet 110, a response packet 112 may include a header 112-0 and, optionally, a payload 112-1. As but one example, a response packet header 112-0 can include a packet start indication that may mark the start of a data packet and a result indication that may distinguish such a response packet from request packets. A response packet payload 112-1 may include data values related to an operation result.

Having described a system in which a CAM device may receive request packets and generate response packets, examples of particular request and response packet formats will now be described.

Figure 2A:
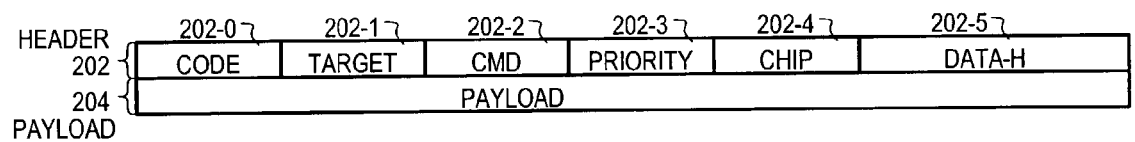

Referring now to FIG. 2A, an example of a request packet is set forth and designated by the general reference number 200. A request packet 200 may include a header 202 and, optionally, a payload 204. A header 202 may include predetermined data fields that may store predetermined data values. In the example of FIG. 2A, a header 202 may include a code field CODE 202-0, a target field TARGET 202-1, a command field CMD 202-2, a priority field PRIORITY 202-3, a device field CHIP 202-4, and data field DATA-H 202-5.

A code field CODE 202-0 may occur at the start of a request packet, to thereby indicate to a receiving device that new packet data is being received. In particular arrangements, a code field CODE 202-0 may serve as both a packet start indicator and a packet payload size indicator. As but one example, a character stored in a code field CODE 202-0 can be decoded by a CAM device into a start indication. In addition or alternatively, a character stored in a code field CODE 202-0 may also be decoded into size value.

A target field TARGET 202-1 may be a data field that can indicate a target destination for a command (requested operation) included in a request packet. A target destination can be a "directed" target or "multicast". A directed target destination can indicate that a requested operation is for execution by a device or particular portions of a device in a CAM-based system. In one approach, a portion of a device can be selected entries for a CAM device or any selected addresses for a memory device such as a RAM.

A multicast target destination may indicate that a data packet may reach multiple devices or multiple portions of a device in a CAM system. A multicast target destination may include "global" target values that correspond to all devices or all portions of a device in a CAM system.

As but one very particular example, a target value TARGET can be a number of bits, for example, 8 bits. All or some of the possible 8-bit combinations can represent different target destination values. Some bit combinations can be predetermined directed target values, while one or more other selected combinations can be predetermined global target values.

A command field CMD 202-2 may indicate a particular type of operation to be executed. Such commands may include, without limitation, searches, reads, writes, parity checks, and "learns." A search command can typically include applying a search key value to CAM entries. According to such a comparison, a CAM device can generate a search result. Such results of a search command can include a match when a key matches one entry, a multiple match, when a key matches multiple entries, and a miss, when a key doesn't match any entry. A match operation is understood to include binary matches, which perfumes a bit-by-bit match between a search key and a CAM entry value, as well as ternary matches, in which portions of data value may be masked from a comparison operation.

Read and write commands may read data from, and write data to particular locations within a CAM device, such as entries or control registers, for example.

A parity check can check the parity of predetermined values within a CAM device.

A learn command may write a search key value to an available CAM entry in the event an initial search operation yields a miss response.

A priority field PRIORITY 202-3 can indicate a priority value for a requested operation. A priority value can restrict an operation to a particular device or to a portion of a device in a system. That is, a device (or portion of a device) can be assigned a particular priority value. According to a comparison between a packet provided priority value and such assigned priority values, a search operation may not be performed on the device (or portion of the device). In particular examples, a portion of a CAM device may include a number CAM entries that may be commonly accessed and/or controlled.

A device field CHIP 202-4 can indicate that a request is intended for a particular device in a system. Thus, a system may include a number of devices, each given a different device identification value (a "chip ID"). If a request includes a device field value that matches a device's identification value, such a request may be executed on a device. In a very particular approach, a request packet may include both a target field and a device field. A target field value may override a device field. For example, a request packet 200 could include a target field 202-1 that stores a "global" target value. In such a case, a command indicated by such a request packet can be executed by a CAM device, even though the CAM device's identification value does not match a value in device field 202-4 of a packet.

A data field 202-5 may store a value used to execute an operation indicated by a request. As but a few very particular examples, in search-type operations, a data field 202-5 may store a portion, or all, of a search key value for use in such a search operation. In the present invention, it is understood that a "search-type" operation as used herein is intended to include learn commands, and "explore" operations that may search CAM entries beyond a designated entry (e.g., only those entries having a higher address than an indicated entry). In write-type operations, a data field 202-5 may store a portion, or all, of a data value that is to be written to a location in a device. A device location may include, without limitation, a CAM entry address, a data register address (e.g., for storing mask values and/or search key values), or a control register address (e.g., for storing values that effect how a device operates).

Like data field 202-5, a payload 204 may include data used in executing a requested operation. As but a few very particular examples, in search-type operations, a data field 202-5 may store a portion of a search key value and a payload 204 may store the remainder of a search key value. In write-type operations, a data field 202-5 may store a portion of write data and a payload 204 may include the remainder of the write data.

Figure 2B:
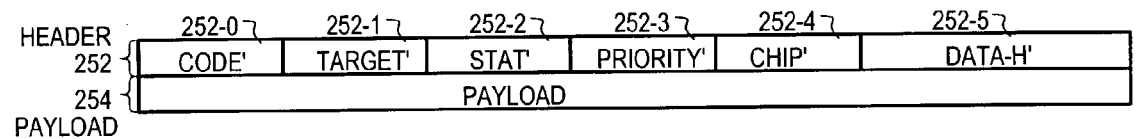

Referring now to FIG. 2B, an example of a response packet is set forth and designated by the general reference 210. A response packet 210 may include a header 252 and, optionally, a payload 254. A response packet 210 may correspond to a request packet, like that shown in FIG. 2A. That is, a response packet 210 may be generated by a CAM device in response to a request packet. Thus, a response packet 210 may include result data and/or status data generated in response to a particular request.

Like a request packet 200, in a particular example of FIG. 2B, a response packet header 252 can include predetermined data fields that may store predetermined data values. FIG. 2B shows an example of various fields, including a code field CODE' 252-0, a target field TARGET' 252-1, a status field STAT' 252-2, a priority field PRIORITY' 252-3, a device field CHIP' 252-4, and a data field DATA-H' 252-5. A code field CODE' 252-0 may be the same as described in a request packet 200.

A target field TARGET' 252-1 can a store data value indicates that a data packet is a response packet, as opposed to a request packet. Consequently, a CAM device may examine such a field to determine how to process an incoming packet.

A status field STAT' 252-2 can store a data value that indicates the status of a request generated from a response packet. In the case of search operations, status indications may include, without limitation, an error value that indicates a search was not completed, a match indication, that signifies that a search key matched one CAM entry value, a multiple match indication, that signifies that a search key matched multiple CAM entries, a miss indication, the signifies a search did not match any targeted CAM entries. Miss indications may also include additional information, such as whether a CAM device has a free entry, or a free sub-block of entries (e.g., collection of free entries), or a free block of entries (collection of free sub-blocks).

A priority field PRIORITY' 252-3 can indicate a priority value for data and/or status carried within a response packet. A device field CHIP' 252-4 may store a value identifying a particular device that generates a response packet.

A data field DATA-H' 252-5 may store data related to a response. As but a few very particular examples, in search-type operations, a data field 252-5 may store a portion, or all, of an index value corresponding to a matching entry, or some default value in the event of a miss. In write-type operations, a data field 202-5 may store a portion, or all, of an address of a location in a device.

Like data field 252-5, a payload 254 may include data resulting from an executed request. For example, in read-type operations, a payload 254 may store data read from a given device location (or location). In the case of write-type operations, a device location may include, without limitation, a CAM entry address, a data register address (e.g., for storing mask values and/or search key values), or a control register address (e.g., for storing values that effect how a device operates).

A response payload 254 may also include command data for other devices. For example, a response generated by a CAM device may include a request for a RAM device, or the like. More particularly, in response to a request packet that includes a search command, a CAM device can generate a response packet giving search results. However, attached to such a response packet may be another request to RAM device that can access data associated with a search result. An example of such a case is shown in FIG. 2C.

Figure 2C:
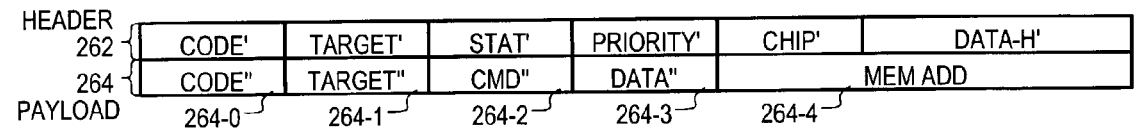

FIG. 2C is a block diagram showing a "request attached" response packet 260. A request attached response packet 260 may include a header portion 262 and a payload 264 that includes a request for a memory device.

A header of a request attached response 260 may include the same general fields as header 252 of FIG. 2B.

An attached request payload 264 may include a code field CODE" 264-0, a target field TARGET" 264-1, a command field CMD" 264-2, a data field DATA" 264-3, and a memory address field MEM ADD 264-4. A code field CODE" 264-0 can be the same as that described for request packet 200 in FIG. 2A.

A target field TARGET" 264-1 can be like a TARGET field 202-1 of FIG. 2A, however, a value stored within target field TARGET" 264-1 may indicate a memory device is an intended recipient of a command. Similarly, a command field CMD" 264-2, like that shown as 202-1 in FIG. 2A, can indicate a command. However, such a command may be executable by a memory device, like a RAM device, and not for a CAM device. In a very particular case, a command may be a read command for retrieving associated data for a search result from a RAM device.

A data field DATA" 264-3 may store data values that may be used in a memory device access operation.

A memory address field MEM ADD 264-4 may store a memory address in a memory device that is to be accessed by an attached request.

Referring now to FIG. 2D, a very particular example of a data packet format is set forth in a block diagram. FIG. 2D includes the same data fields as FIG. 2A, but shows a byte-wise arrangement of data fields. Thus, a code field CODE, target field TARGET, command field CMD, priority field PRIOR, and device field CHIP, may each be a character of one byte (8-bits). Such an arrangement may provide an advantageously small header over other conventional arrangements. A data field INDEX, as shown by vertical "tick" marks may include three bytes (three data characters). As also shown by tick marks, payload "word" PAYLOAD may include eight bytes (eight data characters).

Of course, it is understood that a data packet like that shown in FIG. 2D may take a different form when transmitted. For example, byte values can be encoded into larger size values (e.g., 10-bit values).

Referring now to FIG. 2E, a table is set forth showing but one example of possible command field CMD values for a request packet. FIG. 2E includes a column CMD, which sets forth a hexadecimal number for a command value. In the CMD column, a value "X" represents a "don't care" value. A column OPERATION describes a particular operation indicated by a command value CMD. A column NAME provides a descriptive name for an operation.

The table of FIG. 2E describes operations for CAM devices that have assigned priority values for groups of CAM entries. Thus, search operations may be selectively applied to such groups according to a priority value.

In addition, FIG. 2E also describes operations for CAM devices that can search beyond a given entry (e.g., explore). Such an entry can be indicated by an index value, for example.

It is understood that the operations EXPLORE_KEY_INDEX_LE, EXPLORE_KEY_INDEX_EQ, EXPLORE_KEY_TAG_LE, EXPLORE_KEY_TAG_EQ, SEARCH_KEY_INDEX_LE, SEARCH_KEY_INDEX_EQ, SEARCH_KEY_TAG_LE, SEARCH_KEY_TAG_EQ may be considered search-type operations, as such operations can apply a search key to portions of a CAM array. Likewise, WRITE_KEY, WRITE_MASK, MCAST_KEY, MCAST_MASK, WRITE_CREG, WRITE_BREG, BCAST_CREG, MCAST_BREG, ASSIGN_ID and RESET_IDS can be considered write-type operations, as such operations write data values to entries and/or register locations. Further, READ_KEY, READ_MASK, READ- _CREG, READ_BREG can be considered read-type operations, as such operations read data values from entries and/or register locations.

Of course, as would be understood by the "reserved" command values CX-EX and F8 to FD, additional commands could be added to the example of FIG. 2E.

Referring now to FIG. 2F, a table is set forth showing but one example of possible status field STAT values for a response packet. FIG. 2F includes a column STAT, which sets forth a hexadecimal number for a status value, a description column DESCRIPTION describes a particular result indicated by a status value STAT, and a name column NAME, which provides a descriptive name for a status value.

FIG. 2F shows various examples of results: HIT—SINGLE MATCH ENTRY, which indicates a search key value matches a single valid CAM entry, MISS—SINGLE FREE ENTRY, which indicates that a search key value does not match any valid CAM entries and an entry is available in which to write such a search key value, MISS—SINGLE FREE SUB-BLOCK, which indicates that a search key value does not match any valid CAM entries and a sub-block of entries (e.g., a predetermined group of entries) is available in which to write such a search key value, MISS—SINGLE FREE BLOCK, which indicates that a search key value does not match any valid CAM entries and a group of sub-blocks is available in which to write such a search key value, MISS—NO FREE ENTRIES, which indicates that a search key value does not match any valid CAM entries and no entries are available in which to write such a search key value, HIT—MATCHING ENTRIES, which indicates a search key value matches multiple valid CAM entries, MISS—FREE ENTRIES, which indicates that a search key value does not match any valid CAM entries and multiple entries are available in which to write such a search key value, MISS—FREE SUB-BLOCKS, which indicates that a search key value does not match any valid CAM entries and multiple sub-blocks are available in which to write such a search key value, MISS—FREE BLOCKS, which indicates that a search key value does not match any valid CAM entries and multiple group of sub-blocks are available in which to write such a search key value.

Figure 3:
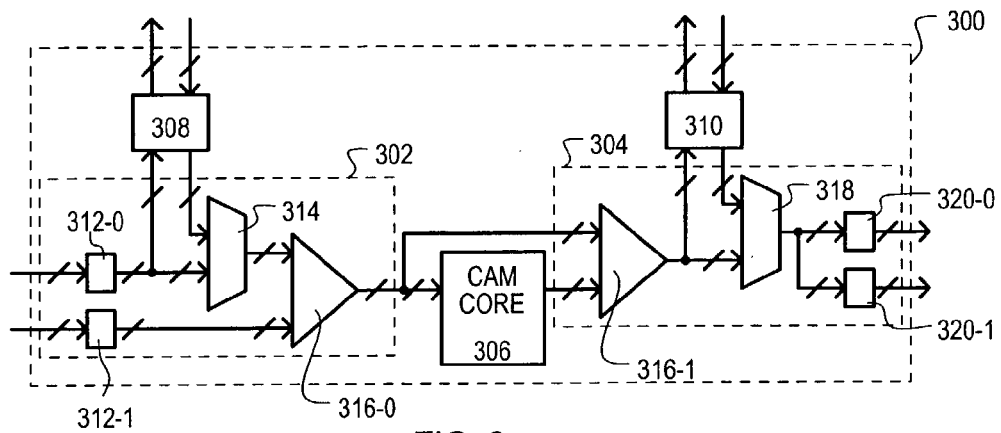
FIG. 3 is a block schematic diagram of a content addressable memory (CAM) device according to one embodiment of the present invention.

Referring now to FIG. 3, an example of a CAM device according to one embodiment is set forth in a block schematic diagram and designated by the general reference character 300. A CAM device 300 may include a depacketizer section 302, a packetizing section 304, a CAM core 306, a first input/output section 308, and a second input/output section 310.

A depacketizer section 302 can be conceptualized as an input interface that receives data packets. Similarly, a packetizing section 304 can be conceptualized as an output interface that can send data packets.

In the arrangement of FIG. 3, a depacketizer section 302 may receive requests and/or responses in a packet form. Various examples of requests and/or responses have been described in FIGS. 2A–2D. A depacketizer 302 may then provide packet data to various inputs of a CAM core 306. Such actions may include detecting a packet start and outputting packet data field values according to data within such a packet.

A packetizing section 304 may receive packet data forwarded from a packetizing section 302 and/or result data generated by a CAM core 306, and provide such data in an output packet.

A CAM core 306 may execute predetermined CAM operations according to received control signals. Thus, a CAM core 306 may include circuits for performing one or more CAM related function. CAM related functions may include, without limitation, searches, reads, writes, parity checks, and "learns." A search operation can typically include applying a search key value to a number of data values stored in entries, or the like. According to such a comparison, a CAM core 306 can generate search results. Search results may include a match when a key matches one entry, a multiple match, when a key matches multiple entries, and a miss, when a key doesn't match any entry. Typically, match responses may be generated when each bit of a key matches all bits of an entry, or when bits of a key match corresponding non-masked portions of an entry. Match responses may also be accompanied by an index value corresponding to a matching location.

Read and write functions may read and write data to particular entries or registers.

A parity check may include checking the parity of all or a portion of a CAM entry with an associated parity bit.

A learn function may write a search key value to an available CAM entry in the event an initial search operation yields a miss response.

Preferably, a CAM core 306 may be capable of generating additional search responses in the case of a miss. As but a few examples, a miss response may also indicate whether any entries are empty. More particularly, a miss response could also indicate if a single entry or some collection of entries (e.g., a block or sub-block) is free. Such a feature may be valuable for a subsequent learn operation.

A first I/O section 308 may enable communication on a non-packet basis between another device and a CAM device. As but one example, a first I/O section 308 may convert packetized commands to commands for another bus type, such as the peripheral component interconnect or a memory bus-type interface, as but two examples.

Similarly, a second I/O section 310 may enable communication on a non-packet basis between another device and a CAM device.

In the very particular example of FIG. 3, a depacketizing section 302 may include receiver circuits 312-0 and 312-1, a first mode multiplexer MUX 314, and a first voting section 316-0. A packetizing section 304 may include a second voting section 316-1, a second mode multiplexer MUX 318, and transmit circuits 320-0 and 320-1.

Figure 4A:
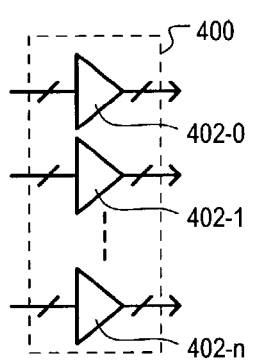
FIG. 4A is a schematic diagram of receiver circuits according to an embodiment.

Receiver circuits (312-0 and 312-1) may receive packet data transmitted over a communication link. One example of a receiver circuit is shown in FIG. 4A, and designated by the general reference character 400. A receiver circuit 400 may include a number of "lane" receivers 402-0 to 402-n. Each lane receiver (402-0 to 402-n) can be connected to a number of conductive lines. Preferably, each lane receiver (402-0 to 402-n) may be connected to a number of data lines and a clock line, for synchronizing a parallel transmission of data. Even more preferably, each lane receiver (402-0 to 402-n) may be connected to ten data lines a single clock line.

Figure 4B:
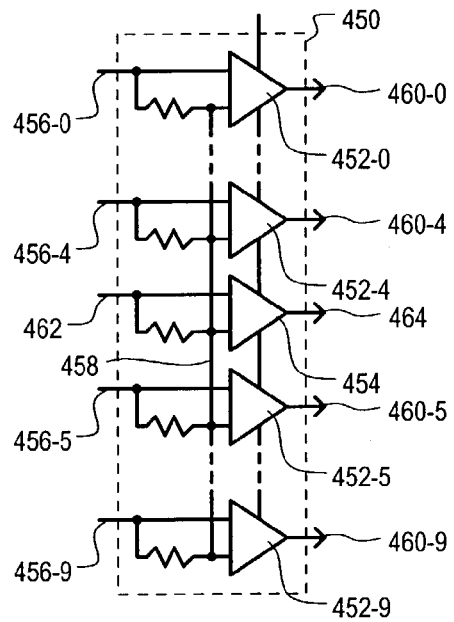
FIG. 4B is a schematic diagram of a lane receiver circuit according to an embodiment.

FIG. 4B shows one example of a lane receiver shown by the reference character 450. A lane receiver 450 may include a number of data line amplifiers 452-0 to 452-9 and at least one clock amplifier 454. A data line amplifier (452-0 to 452-9) may have one input connected to a corresponding input data line 456-0 to 456-9, and another input connected to a common reference line 458. Each data line amplifier (452-0 to 452-9) may drive a corresponding output data line 460-0 to 460-9 by amplifying a difference between its two inputs. A clock amplifier 454 can have input connected to an input clock line 462 and another input connected to the common reference line 458. Like a data line amplifier (452-0 to 452-9), a clock amplifier 454 can drive a clock output line 464 by amplifying a difference between its two inputs.

Lane receives (e.g., 450) may receive encoded data values. Such encoding may include those methods and devices shown in commonly-owned co-pending U.S. patent application Ser. No. 10/024,609, titled HIGH SPEED TRANSMISSION SYSTEM WITH CLOCK INCLUSIVE BALANCED CODING, by James et al.

Figure 5:
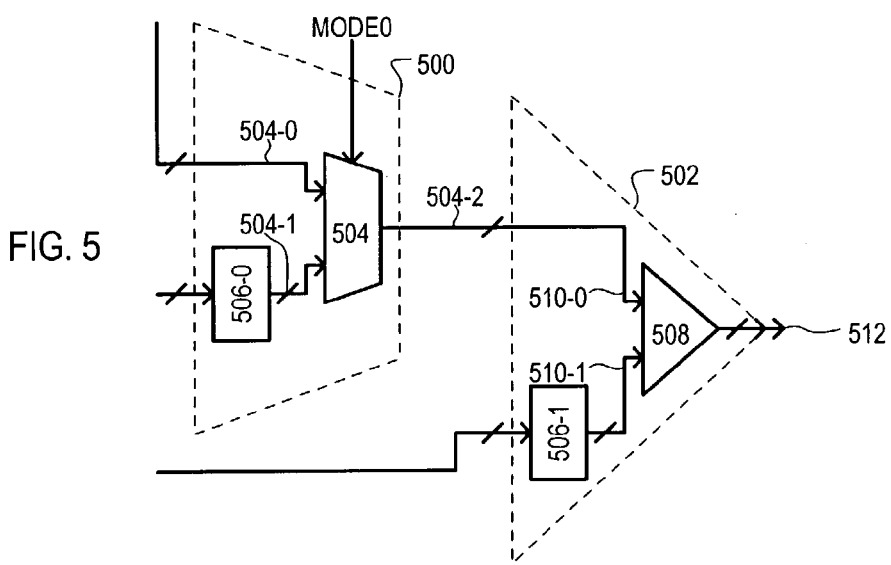
FIG. 5 is a block schematic diagram of a first mode multiplexer and first voting section according an embodiment.

One example of a first mode MUX and first voting section will now be described with reference to FIG. 5. FIG. 5 shows a first mode MUX 500 and a first voting section 502. A first mode MUX 500 can correspond to that shown as 314 in FIG. 3, and a first voting section 502 can correspond to that shown as 316-0 in FIG. 3.

A first mode MUX 500 may include a multiplexer (MUX) circuit 504 having a first input 504-0, a second input 504-1, and an output 504-2. A first mode MUX 500 may also include a packet input circuit 506-0. According to a mode input MODE0, a MUX circuit 504 may provide data at first input 504-0 or a second input 504-1 at output 504-2. In one particular arrangement, a mode input MODE0 may be set by a programmable circuit element, or the like. A packet input circuit 506-0 may receive data values from receiver circuits, or the like, and provide valid packet data as an output. A packet input circuit 506-0 may detect a start of a data packet, and determine various packet features, such as packet size and/or packet type, as but two examples.

Referring still to FIG. 5, a first voting section 502 may include a voting portion 508 and a packet input circuit 506-1. A voting portion 508 can receive data packet values at inputs, and provide an output data value at a vote output. More particularly, a voting portion 508 may include first and second inputs 510-0 and 510-1, one or both of which may receive input packet data. If one input (510-0 or 510-1) receives packet data, such packet data may be provided at output 512. If both inputs (510-0 and 510-1) receive packet data, a voting portion 508 may "vote" between packet data, according to predetermined data fields in the packets, and provide output packet data at output 512.

Figure 6A:
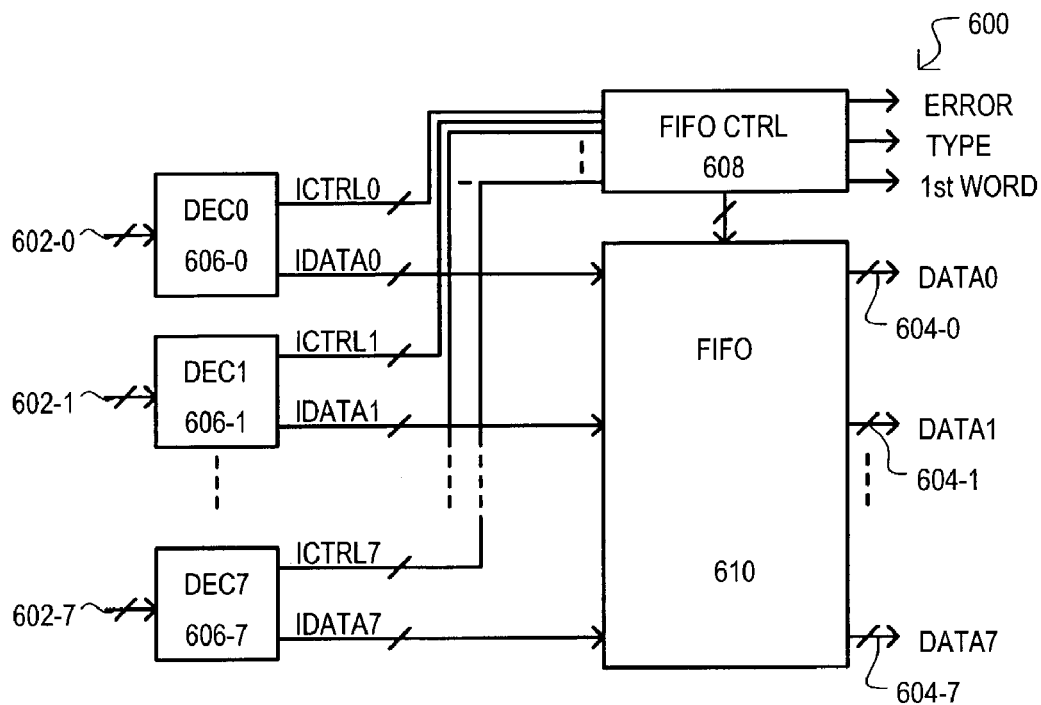
FIG. 6A is a block schematic diagram of a packet input circuit according to an embodiment.

Referring now to FIG. 6A, one example of a packet input circuit is set forth in a block schematic diagram, and designated by the general reference character 600. A packet input circuit 600 can correspond to packet input circuit 506-0 and/or 506-1, shown in FIG. 5.

The particular packet input circuit 600 shown in FIG. 6A can receive input packet data along eight input data lanes 602-0 to 602-7, and provide output packet data along eight output data lanes 604-0 to 604-7. In one very particular approach, each input data lane (602-0 to 602-7) may include ten conductive lines, and each output data lane (604-0 to 604-7) may include eight conductive lines.

A packet input circuit 600 may include decoding circuits 606-0 to 606-7, a memory control circuit 608, and a memory circuit 610. In FIG. 6A, a memory circuit 610 can include a first-in-first-out (FIFO) buffer circuit. Each decoding circuit (606-0 to 606-7) can receive an encoded data character, and detect when such data characters have predetermined values, and generate feature values (ICTRL0 to ICTRL7) in response. In addition, each decoding circuit (606-0 to 606-7) can provide an output data character (IDATA0 to IDATA7) that may represent a data packet features or decoded character value.

Figure 6B:
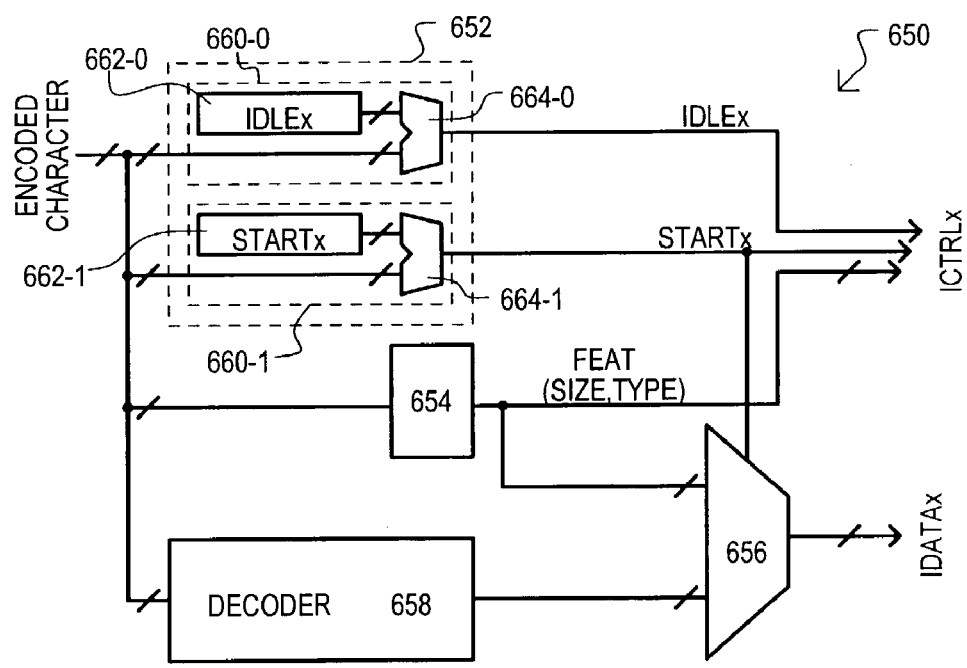
FIG. 6B is a schematic diagram of a decoder circuit according to an embodiment.

One particular example of a lane input circuit is shown in FIG. 6B, and designated by general reference character 650. A decoding circuit 650 may include a code detector 652, a feature decoder 654, a data multiplexer (MUX) 656, and a decoder 658.

An encoded character ENCODED CHARACTER may be received by a code detector 652 and a decoder 658. Such an encoded character may be received by way of a data lane, like those shown as 602-0 to 602-7 in FIG. 6A.

A character detector 652 can determine when a received encoded character matches one or more predetermined patterns, and provide detect results as output values. In the very particular case of FIG. 6B, a code detector 652 can provide an idle indication IDLEx and a start indication STARTx. An idle indication IDLEx can indicate when a received encoded data character matches one or more predetermined idle codes. Similarly, a start indication STARTx can indicate when a received encoded data character matches one or more start predetermined start codes. An idle code may represent an idle state (e.g., no packet data being transmitted) for a data lane.

A feature decoder 654 may determine certain features from encoded data characters. In the very particular example shown, a feature decoder 654 may provide a size value SIZE or a type value TYPE. A size value SIZE may correspond to a size of a packet and preferably indicate a size of a payload, more preferably a number of words in a packet payload (it being understood that a word may preferably include 64 bits). A type value TYPE may distinguish certain packet types from other packet types. Preferably a type value TYPE may distinguish request type packets from response type packets.

Feature values (e.g., IDLEx, STARTx, SIZE, TYPE) are shown collectively in FIG. 6B as control signals ICTRLx. In one arrangement, feature values may be forwarded to a first input to a data MUX 656.

A decoder 658 may decode encoded characters to generate decoded data values. Such decoded data values may be provided to a second input of data MUX 656. In one particular arrangement, a decoder 658 may decode ten bit encoded characters into eight bit decoded characters.

A data MUX 656 may selectively output feature values (e.g., SIZE, TYPE) according to a start indication STARTx. More particularly, if a start indication STARTx is active, feature values may be provided at a data MUX output 656. However, if a start indication STARTx is inactive, decoded character values from decoder 658 may be provided at a data MUX output 656.

Data provided at a data MUX 656 output is shown as IDATAx in FIG. 6B.

In FIG. 6B, a code detector 652 may include one or more compare circuits 660-0 and 660-1. Each compare circuit (660-0 and 660-1) may compare a received encoded character to a predetermined value and activate a corresponding result value.

In one very particular approach, a compare circuit (660-0 or 660-1) may include a code provider (662-0 or 662-1) and a comparator circuit (664-0 or 664-1). A comparator circuit (664-0 or 664-1) may receive an encoded character at one input and a predetermined code value (e.g., IDLE or START) at another input, and provide a result value (e.g., IDLEx or STARTx) at an output.

Of course, while the particular example of FIG. 6B shows the comparison of encoded characters to two possible code values (IDLE and START), it is understood that additional comparison operations can be possible. For example, a code detector 652 may compare an encoded character to multiple possible start code values and multiple possible idle code values, and logically combine comparison results to generate a result value.

Still further, it is understood that compare operations in a compare circuit (such as 660-0 and 660-1) may activate a result value according to an exact match and/or a range match.

Referring back to FIG. 6A, a memory control circuit 608 may receive feature values ICTRL0 to ICTRL7 from decoding circuits 606-0 to 606-7. In response to such features values (ICTRL0 to ICTRL7), a memory control circuit 608 may store data values provided by decoding circuits (606-0 and 606-7), and/or provide additional indications for processing a received data packet.

In the very particular example of FIG. 6A, a memory control circuit 608 may provide an error value ERROR that can indicate incomplete reception of a data packet, a type value TYPE that can indicate which type of packet is received (e.g., request or response), and a header indication $1^{st}$ WORD, that can indicate when received data values are parts of a header. In the example, shown a first word of a transmitted packet can be considered a header for such a packet.

Figure 6C:
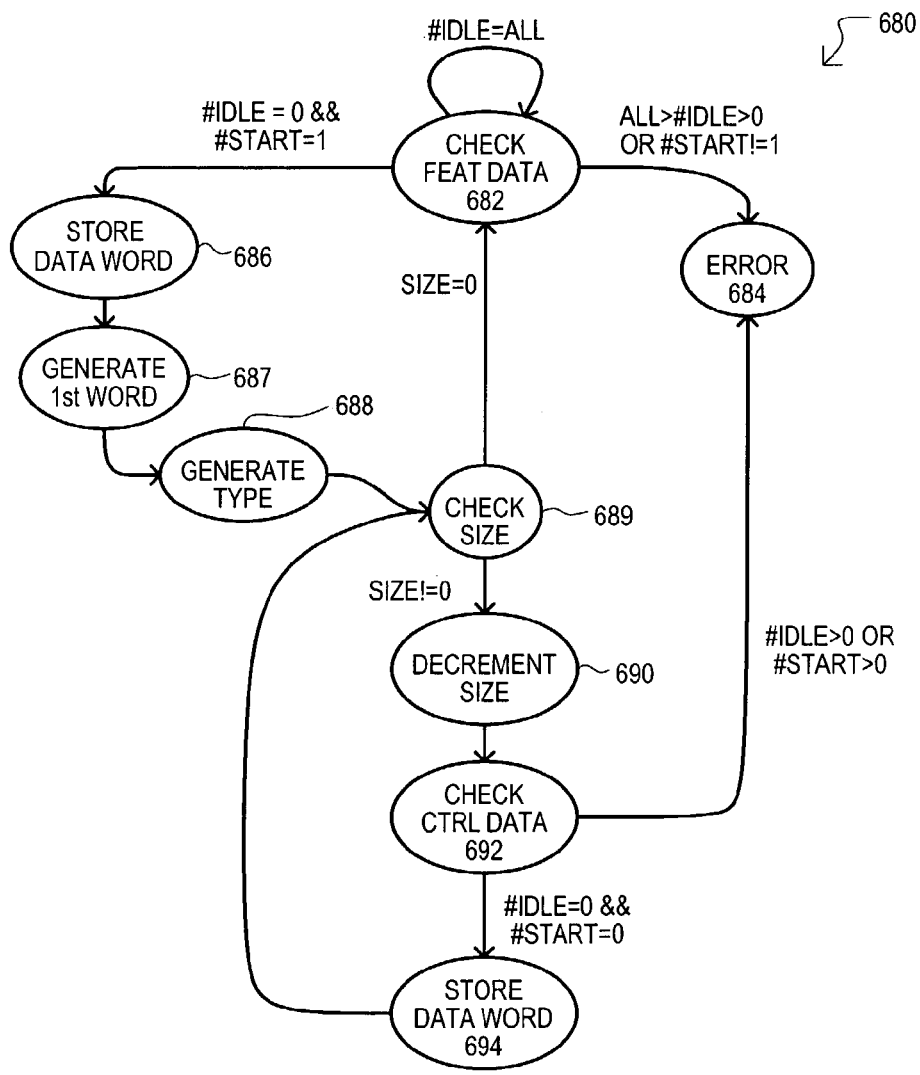
FIG. 6C is state diagram showing a memory control circuit according to an embodiment.

Referring now to FIG. 6C, a memory control circuit operation, such as that shown as 608 in FIG. 6A, is set forth in a state diagram. A memory control circuit and method according to FIG. 6C is designated by the general reference character 680 and may include checking feature data (e.g., ICTRL0 to ICTRL7) 682.

In FIG. 6C, checking control data 682 may include determining how many idle indications are active (#IDLE) and how many start indications are active (#START). In the particular example shown, it is assumed the packet data may be received as multiple encoded characters in parallel. Further, it is assumed that proper transmission includes either the transmission of parallel encoded data characters, all of which can be data values or idle values.

Accordingly, in FIG. 6C, if feature data indicates that all received encoded characters are idle (#IDLE=ALL), a memory control circuit/method 680 can continue check control data 682. However, if an idle indication is active, but not all idle indications are active (ALL>#IDLE>0), an error may have occurred. Thus, an error indication can be generated 684. Similarly, if a number of start indications is not equal to one (#START!=1), another type of error may have occurred, and an error indication can be generated 684.

If control data indicates that a received parallel set of encoded characters results in no idle indications and one start indication (#IDLE=0 && #START=1), a first valid portion of a data packet (e.g., a first data word) can have been received (e.g., a header). Such a data word may be stored 686.

Further, once it has been determined that a first word has been stored, a memory control circuit/method 680 may generate a first word indication 687 and a type value 688. Generating a type value 688 may include outputting a predetermined feature value.

Once a first portion of a packet has been stored, a memory control circuit/method 680 can check a size value for a data packet 689. Such a size value may be determined from an encoded character. Preferably, a packet start code can serve the dual purpose of indicating a start of a data packet, as well as a size of data packet.

In FIG. 6C, if a size value is zero (SIZE=0), a data packet can be determined to have no payload, and a memory control circuit/method 680 may return to a state 682.

If a size value is not zero (SIZE!=0), a size value may be decremented 690.

Once a size value is decremented, a memory control circuit/method 680 may check control data for a next group of encoded characters 692. If such a next group of encoded characters includes one or more idle codes (#IDLE>0), a payload data word may have been lost, thus, an error indication may be generated 684. Similarly, if a next group of encoded characters results in one or more start indications (#START>0), a new packet may have been received prematurely, and an error indication may be generated 684. However, if a next group of encoded characters results in no idle or start indications (#IDLE=0 && #START=0), such a next portion (e.g., word) may be stored 694.

Once such a next portion is stored, a memory control circuit/method 680 may return to a state 689, once again checking a packet size value.

Referring back to FIG. 6A, it is noted that feature information for a packet (e.g., $1^{st}$ WORD, TYPE) may be output with corresponding decoded data values (DATA0 to DATA7). From such feature information, a CAM device may latch data in appropriate internal circuits, as will be described at a later point herein.

Figure 7:
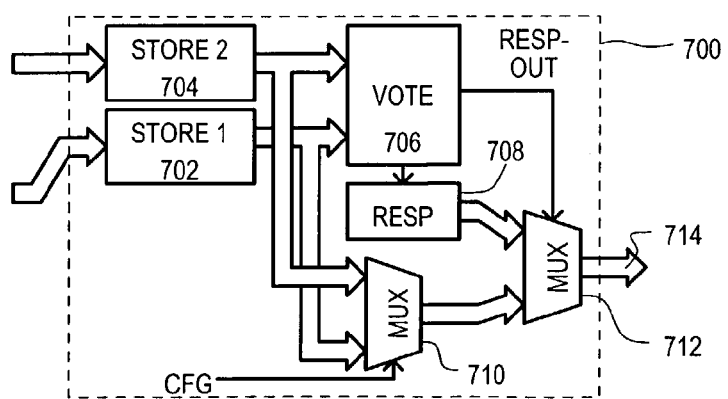
FIG. 7 is a block schematic diagram of a voting circuit according to an embodiment.

One example of methods and devices that may decoder feature information from a packet is shown in commonly-owned co-pending U.S. patent application Ser. No. 10/264,684, titled METHOD AND APPARATUS FOR FRAMING A DATA PACKET, by James et al. Referring now to FIG. 7, one example of a vote portion, like that shown as 508 in FIG. 5, is set forth in a block schematic diagram and designated by the general reference character 700. A vote circuit 700 may include a first input store 702, a second input store 704, a voting circuit 706, a response store 708, a forwarding multiplexer (MUX) 710, a vote MUX 712, and an output path 714.

First and second input stores (702 and 704) can store all, or portions of, request or response data. Referring back to FIG. 3 in conjunction with FIG. 7, if a voting portion 700 is part of a first voting section 316-0, a first input store 702 may receive packet data from a first input port, by way of a receiver circuit 312-1. Further, a second input store 704 may receive packet data from a second input port, by way of receiver circuits 312-0 and a first mode multiplexer MUX 314, or result data from an output section 308.

Referring still to FIG. 7, a vote circuit 706 may receive all, or preferably selected portions of data stored in inputs stores (702 and 704). According to such data, a vote circuit 706 may select or generate a summary response (e.g., a response based on two received responses) at response store 708. In addition, a vote circuit 706 may generate a result RESP-OUT that can indicate a voting operation is complete.

A forwarding MUX 710 may be preconfigured to forward received requests from either input store (704 or 702). In FIG. 7, a signal CFG may control an operation of a forwarding MUX 710.

A vote MUX 712 may be controlled by a result RESP-OUT. Thus, if a response is not ready, an output from a forwarding MUX 710 may be provided on output path 714. However, if a result RESP-OUT indicates a response is ready, a vote MUX 712 may output a summary response, which can be a response based on two received responses.

Figure 8:
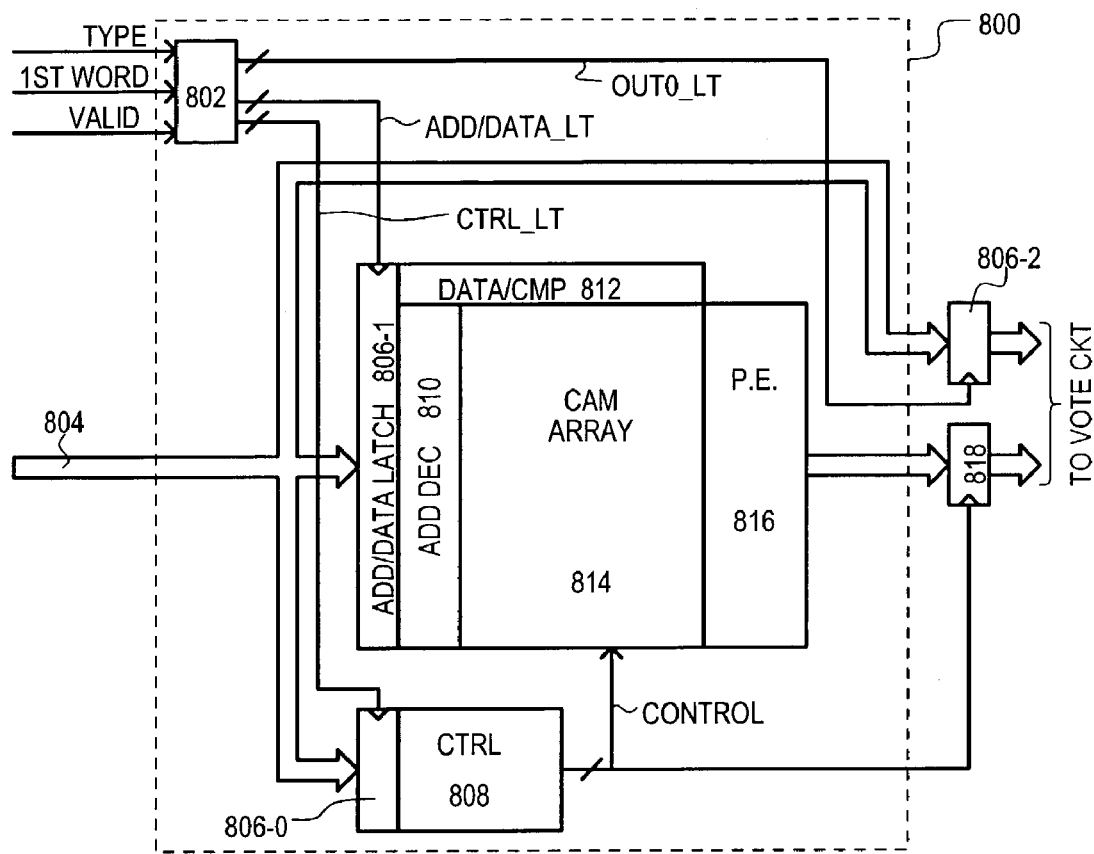
FIG. 8 is block schematic diagram of a CAM core according to an embodiment.

Referring now to FIG. 8, one example of a CAM core is shown in a block diagram and designated by the general reference character 800. A CAM core 800 may correspond to CAM core shown as item 306 in FIG. 3.

A CAM core 800 may include bus control logic 802 and an input bus 804. An input bus 804 may receive data from a de-packetizing section (e.g., 302 in FIG. 3). Data on input bus 804 may be selectively latched according to control signals generated by bus control logic 802. In response to such latched data, a CAM core 800 may execute selected CAM related operations.

In the very particular example of FIG. 8, a CAM core 800 may include a control latch 806-0, an address/data latch 806-1, and a "through data" latch 806-2. A control latch 806-0 may latch data on input bus 804 in response to first latch control signals CTRL_LT, generated by bus control logic 802. Similarly, an address/data latch 806-1 may latch data on input bus 804 in response to second latch control signals ADD/DATA_LT, and through data latch 806-2 may latch data on input bus 804 in response to third latch control signals OUT0_LT.

Data latched within control latch 806-0 can be provided to a control circuit 808. Data latched within address/data latch 806-1 can be provided to an address decoder 810 and/or data/compare circuits 812. Data latched within a through data latch 806-2 can be provided to a packetizing section (such as that shown as 304 in FIG. 3).

A CAM core 800 may further include a CAM array 814, a priority encoder 816 and a result output latch 818. A CAM array 814 may include a number of entries for storing data values for comparison with applied search key values. Such CAM entries may be accessed according to the operation of an address decoder 810. Data values for storage, and the application of search keys can occur by way of data/compare circuits 812. Results generated by a CAM array 814 can prioritized and encoded into an output index values by a priority encoder 816.

Having described one example of a CAM core 800, the operation of such a CAM core will now be described.

It will first be assumed that a request packet with a payload is received by a CAM device. A request packet may have the same general arrangement as that shown in FIG. 2A. A depacketizing section may "de-packetize" such packet data into input data values (e.g., words), and place such data onto input bus 804 with corresponding control values (e.g., TYPE, $1^{st}$ WORD, ERROR).

In the case of a valid request packet, a type value TYPE would indicate a request. A valid request packet may provide a first word of data that may be conceptualized as a header and a second word of data that may be conceptualized as a payload. Thus, as such a first header word is placed on input bus 804, a first word indication $1^{st}$ WORD may be active, but as a second payload word is placed on input bus 804 a first word indication $1^{st}$ WORD may be inactive.

In response to a "request" type indication TYPE and an active first word indication $1^{ST}$ WORD, first latch control signals CTRL_LT may latch a command value (from a field like 202-2 in FIG. 2A) in control latch 806-0. Such a command may then be decoded by a control circuit 808 to generate control signals CONTROL for the timing and activation of circuits within CAM core 800. In addition, second control signals ADD/DATA_LT may latch a target value, priority value, chip value, and other data values (from fields like 202-1, 202-3, 202-4 and/or 202-5) in address/data latch 806-1. Finally, third control signals OUT0_LT can latch all of a first word in through data latch 806-2.

In response to a "request" type indication (TYPE) and an inactive first word indication $1^{ST}$ WORD (indicating that a data word is not a first data word), first latch control signals CTRL_LT may prevent data from being latched in control latch 806-0. However, second and third latch control signals (ADD/DATA_LT and OUT0_LT) can latch such data in both address/data latch 806-1 and through data latch 806-2.

In this way, request packet data may be applied to a CAM core to generate result data, and in addition, such request data can be stored in a through data latch 806-2 for subsequent output as a request data packet.

Referring still to FIG. 8, it will now be assumed that a response packet with a payload is received by a CAM device. A response packet may have the same general arrangement as that shown in FIG. 2B. As in the case of a request packet, a depacketizing section may "de-packetize" such a packet data into input data values (e.g., words), and place such data onto input bus 804 with corresponding control values (e.g., TYPE, $1^{st}$ WORD, ERROR).

In the case of a valid response packet, a type value TYPE would indicate a response. A valid response packet may provide a first word of data, which may be conceptualized as a header, and a second word of data that may be conceptualized as a payload.

When a type indication TYPE signifies a response packet, first latch control signals CTRL_LT may prevent data from being latched in a control latch 806-0 and second control signals may prevent data from being latched in address/data latch 806-1. However, third control signals OUT0_LT can latch consecutive words of a response in through data latch 806-2.

It is noted that a response packet, like that described above, can be generated by another CAM device in response to a request. In one arrangement, at the same time such response data is latched in through latch 806-2 (as a "remote" response), a CAM core 800 may generate result data for the same request (as a "local" response). Such data can be latched in local latch 818. Thus, through latch 806-2 and local latch 818 may both store response data for a same request. Such response data may then be "voted" on in a packetizing section (like that shown as 304 in FIG. 3), to generate an output response for a CAM device.

In this way, response packet data may be stored in a through data latch 806-2 and evaluated with respect to local response data to generate an output response packet for a CAM device.

It is understood that a data bus 804 can be subject to some variation. For example, such a data bus may not be formed from a single set of conductive lines. A data bus may include "bus repeater" circuits or other intervening logic between bus lines and latches (e.g., 806-0 to 806-2). Still further, one latch may receive a different number of bus lines than another latch. As but one very particular example, a control latch 806-0 could be connected to as few as eight data bus lines for carrying eight-bit command data, while an address/data latch 806-1 may be connected to 64 data bus lines. Still further, while the description shows data latches 806-0, 806-1, 806-2, alternate arrangements may include gate structures, or the like, that can allow data to flow through to other circuits.

Referring back to FIG. 3, it will be recalled that a CAM device may include a de-packetizing section 304.

Figure 9:
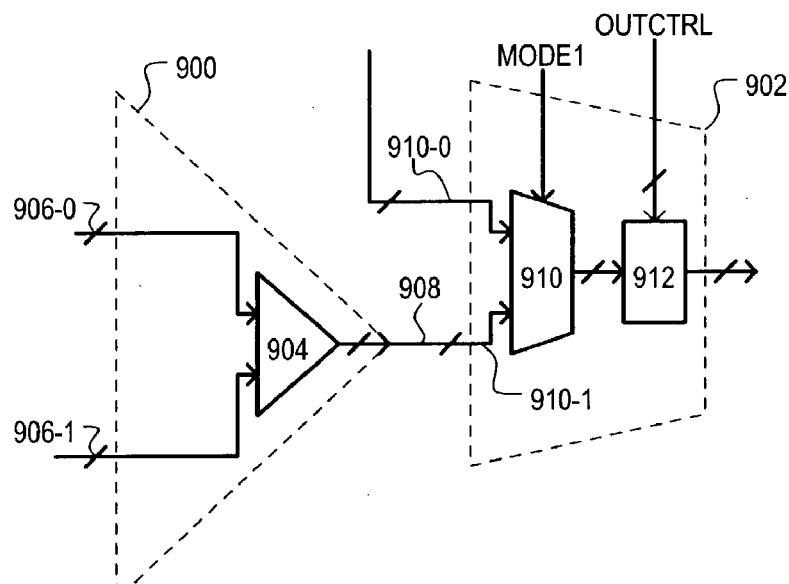
FIG. 9 is a block schematic diagram of a second voting section and second mode multiplexer according to an embodiment.

One example of a second voting section and second mode MUX will now be described with reference to FIG. 9. FIG. 9 shows a second voting section 900 and a second mode MUX 902 and that can correspond to those shown as 316-1 and 318, respectively, in FIG. 3.

A second voting section 900 may include a voting portion 904. A voting portion 904 can receive remote data values at one input, and local data values at another input. More particularly, a voting portion 904 may include first and second inputs 906-0 and 906-1. A first input 906-0 may receive request data that is to be passed through a CAM device, or a remote response data generated by another device and received by the CAM device. If one input (906-0 or 906-1) receives data, such packet data may be provided at an output 908. If both inputs (906-0 and 906-1) receive data, a voting circuit 904 may "vote" between such data sets according to predetermined data fields in the packets, and provide output data at output 908.

In one very particular case, a vote circuit 904 may have the same general construction as set forth in FIG. 7.

A second mode MUX 902 may include a multiplexer (MUX) circuit 910 having a first input 910-0, a second input 910-1, and an output 910-2. A second mode MUX 902 may also include a packet output circuit 912.

According to a mode input MODE1, a MUX circuit 910 may provide data at first input 910-0 or a second input 910-1 as output data at output 910-2. In one particular arrangement, a mode input MODE1 may be set by a programmable circuit element, or the like.

A packet output circuit 912 may receive data values from a CAM core (e.g., item 306 in FIG. 3) or I/O circuit (e.g., item 310 of FIG. 3), and provide such data as an output data packet. A packet output circuit 912 may receive control information OUTCTRL that can indicate a start of a data packet and/or various other packet features. Certain packet features, such as packet size and/or packet type, can be encoded into predetermined code values.

Referring now to FIG. 10A, one example of a packet output circuit is set forth in a block schematic diagram, and designated by the general reference character 1000. A packet output circuit 1000 can correspond to packet output circuit 912 in FIG. 9.

The particular packet output circuit 1000 shown in FIG. 10A can receive output data along eight internal data lanes 1002-0 to 1002-7, and provide output packet data along eight output data lanes 1004-0 to 1004-7. In one very particular approach, each internal data lane (1002-0 to 1002-7) may include eight conductive lines, and each output data lane (1004-0 to 1004-7) may include ten conductive lines.

A packet output circuit 1000 may include encoding circuits 1006-0 to 1006-7 corresponding to each internal data lane (1002-0 to 1002-7). Each encoding circuit (1006-0 to 1006-7) can receive a non-encoded data character, and encode such a value into an encoded character value. Such an encoding operation may occur in response to control information OUTCTRL. In the very particular example of FIG. 10A, control information OUTCTRL may include a first word indication 1$^{st}$ WORD and an idle indication IDLE.

One particular example of an encoding circuit is shown in FIG. 10B, and designated by general reference character 1050. An encoding circuit 1050 may include a control code encoder 1052, a data encoder 1054, a data multiplexer (MUX) 1056, and an idle code MUX 1058.

A data character DATAx may be received by a control code encoder 1052 and a data encoder 1054. A control code encoder 1052 may encode such a data character into predetermined control codes. As but one very particular example, given packet size values can be encoded into predetermined "start" codes. In one approach, a control code encoder 1052 may generate 10-bit code values.

In a similar fashion, a data encoder 1054 can encode data characters into predetermined encoded data characters. In one approach, a data encoder 1054 may encode eight bit packet data characters into ten bit encoded characters.

A control code encoder 1052 may provide control codes to one input of a data MUX 1056, while a data encoder 1054 may provide encoded data characters to another input of data MUX 1058.

A data MUX 1056 may selectively output either a control code or an encoded data character according to a first word indication 1$^{st}$ WORD. In the particular example of FIG. 10B, a data MUX 1056 may output a control code when a first word indication 1$^{st}$ WORD is active, and output an encoded data character when a first word indication 1$^{st}$ WORD is inactive. In this way, control codes can be provided to a header portion of a data packet (e.g., a first word of a data packet in this case) and encoded data character can be provided as a payload portion of a data packet.

An idle code MUX 1058 may selectively output values from data MUX 1056 or alternatively an idle code IDLEx in response to an idle control signal IDLE. An IDLE signal can be active when valid data is not being output from data MUX 1056. In one approach, an idle code IDLEx can be a ten bit value.

In this way, an encoding circuit 1050 may output either packet data or idle characters.

Referring still to FIG. 10B, it is noted that in some arrangements, selected encoding circuit may not include a control code encoder 1012 or data MUX 1056. Thus, such encoding circuits may provide either encoded data values or idle codes as output values.

Referring once again to FIG. 3, transmit circuits (such as those shown in FIG. 3 as 320-0 and 320-1) may receive packet data, and transmit such packet data over a communication link. One example of a transmit circuit is shown in FIG. 11A, and designated by the general reference character 1100. A transmit circuit 1100 may include a number of "lane" transmitters 1102-0 to 1102-n. Each lane transmitter (1102-0 to 1102-n) can be connected to a number of conductive lines. As but one example, each lane transmitter (1102-0 to 1102-n) may be connected to a number of data lines and a clock line, for synchronizing a parallel transmission of data. Even more preferably, each lane transmitter (1102-0 to 1102-n) may be connected to ten data lines a single clock line.

FIG. 11B shows one example of a lane transmitter that designated by the reference character 1150. A lane transmitter 1150 may include a number of data line amplifiers 1152-0 to 1152-9 and at least one clock amplifier 1154. A data line amplifier (1152-0 to 1152-9) may have one input connected to a corresponding input data line 1156-0 to 1156-9. Each data line amplifier (1152-0 to 1152-9) may drive a corresponding output data line 1160-0 to 1160-9 according to the logic at its input. A clock amplifier 1154 can have input connected to an input clock line 1158 and another input connected to an output clock line 1162. Like a data amplifier, a clock amplifier 1154 can drive a clock output line 1164 by amplifying a received input clock signal.

Referring back to FIGS. 2A–2D, it is noted that the various examples of data packets may preferably be transmitted in parallel. That is, if reference is made to FIG. 2A, data for a header 202 may be transmitted in parallel, preferably as eight data characters in parallel, as shown in FIG. 2D. However, it may be desirable to transmit such data in narrower character widths. Examples of such alternate widths are shown in FIGS. 12A to 12C.

FIG. 12A shows one example of a packet like that shown in FIG. 2A transmitted at a half-word width (where the header occupies one word). Thus, if FIG. 2A shows an example where data may be received by a CAM device as eight characters in parallel, FIG. 12A shows a case where a data packet may be received as a sequence of four parallel characters.

In a similar fashion, FIG. 12B shows one example of a packet like that shown in FIG. 12A transmitted at a quarter-word width (where the header occupies one word), and thus can represent a data packet received as a sequence of two parallel characters. FIG. 12C shows one example of a packet like that shown in FIG. 12A transmitted at an eighth-word width, and can represent a data packet received as a sequence of single characters.

To accommodate different width transmission formats, like those shown in FIGS. 12A to 12C, a CAM device may include input de-multiplexers to translate non-word width data into word width data for processing internally. Similarly, a CAM device may include output de-multiplexer to translate internal word width data into non-word widths for transmission.

One particular example of a first mode MUX and voting section that can include input de-multiplexers is set forth in FIG. 13. FIG. 13 includes a first mode MUX 1300 and a voting section 1302. FIG. 13 includes the same constituents as FIG. 5, but with the first digits being a "13" instead of a "5."

Unlike the arrangement of FIG. 5, in FIG. 13, data input to a packet input circuit 1306-0 may be processed by an input de-multiplexer 1314-0. In the same general fashion, data input to packet input circuit 1306-1 may be processed by input de-multiplexer 1314-1.

As shown in FIG. 13, input de-multiplexers (1314-0 and 1314-1) may commonly receive mode control signals MODE_WIDTH_IN. Each input de-multiplexer (1314-0 and 1314-1) may convert data characters received in parallel, into wider character widths. More particularly, each input de-multiplexer (1314-0 and 1314-1) may receive data at a first character width, and output such data in a larger width. Even more particularly, each input de-multiplexer (1314-0 and 1314-1) may receive data as one, two, four or eight parallel characters, and provide output data as eight parallel characters.

Figure 14:
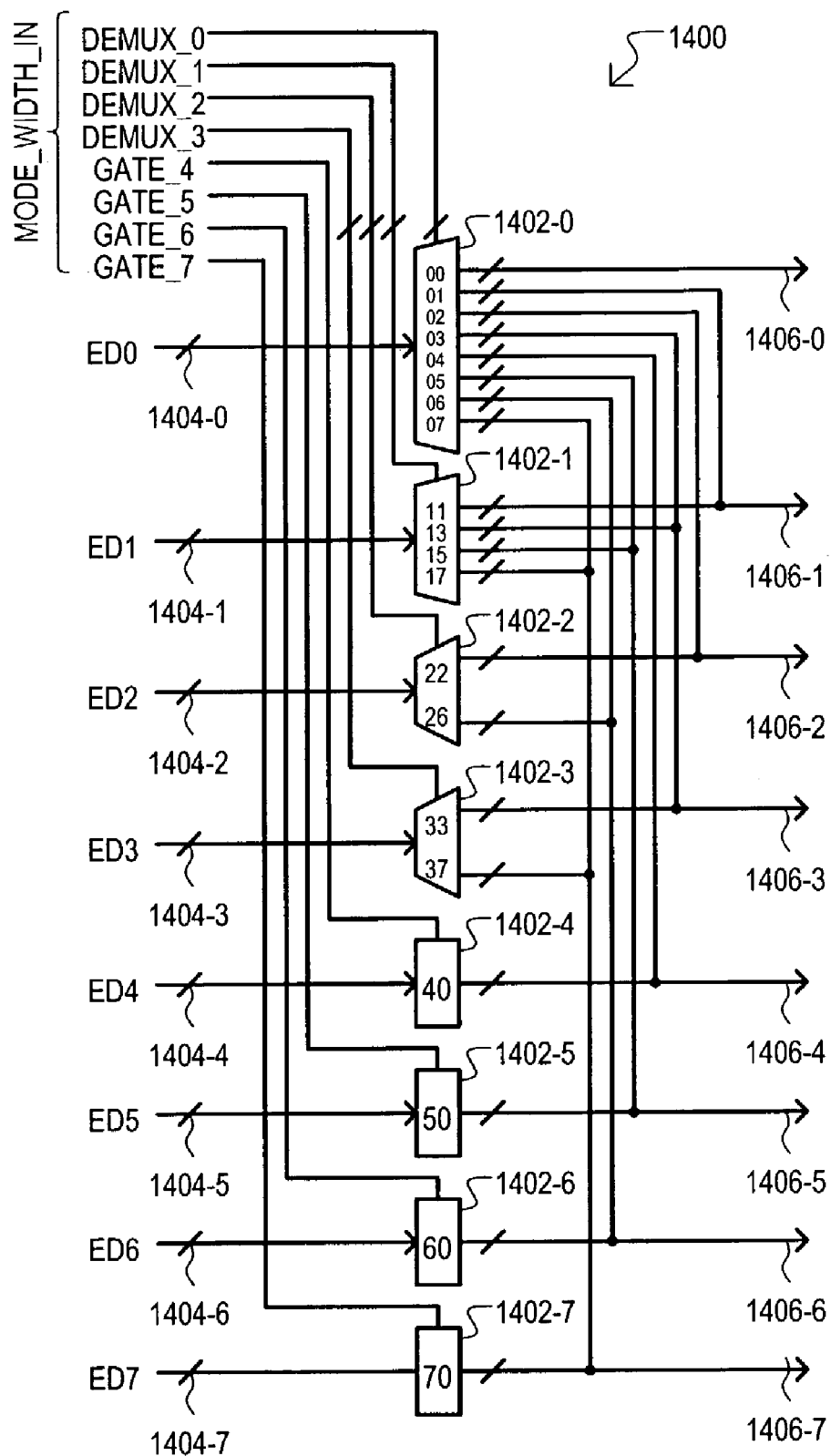
FIG. 14 is a schematic diagram of an input de-multiplexer according to an embodiment.

Referring now to FIG. 14, one example of an input de-multiplexer is set forth in a schematic diagram and designated by the general reference character 1400. An input de-multiplexer 1400 may include a number of de-multiplexer (de-MUX) circuits 1402-0 to 1402-3 and/or gate circuits 1402-4 to 1402-7, each of which can receive an input encoded data character ED0 to ED7 on input data lanes 1404-0 to 1404-7. According to control signals MODE_WIDTH_IN, de-MUX circuits (1402-0 to 1402-3) and gates (1402-4 to 1402-7) can provide received data on selected output data lanes (1406-0 to 1406-7).

The particular example of FIG. 14 illustrates de-multiplexing operations by numbers in each de-MUX circuit or gate (1402-0 to 1402-7). Each number indicates a selectable logical path between an input data lane (1404-0 to 1404-7) and an output data lane (1406-0 to 1406-7). For example, for de-MUX circuit 1402-0, paths "00", "01", "02" can be path between input data lane 1404-0 and output data lanes 1406-0, 1406-1 and 1406-2, respectively.

The operation of the input de-multiplexer of FIG. 14 is shown in FIG. 15. FIG. 15 is a timing diagram that shows which particular paths within a de-MUX circuit or gate (1402-0 to 1402-7) are enabled according to a particular mode. Modes are represented below the horizontal axis as character widths. Thus, a "x1" mode can correspond to FIG. 12C, "x2" mode can correspond to FIG. 12B, and "x4" mode can correspond to FIG. 12A.

Referring now to FIG. 14 in conjunction with FIG. 15, in a "x1" mode, a de-MUX circuit 1402-0 may sequentially enable its corresponding paths "00" to "07" to thereby convert a serial stream of data characters into a single parallel word or eight characters. De-MUX circuits 1402-1 to 1402-3 and gates 1402-4 to 1402-7 may disable all of their respective data paths. In a "x2" mode, de-MUX circuits 1402-0 and 1402-1 may enable paths in parallel to thereby convert a serial stream of two data characters into a single parallel word of eight characters. De-MUX circuits 1402-2 and 1402-3 and gates 1402-4 to 1402-7 may disable all of their respective data paths. The remaining modes follow from the above description.

Just as a CAM device may include input de-multiplexers to translate non-word width data into word width data internally, in addition or alternatively, a CAM device may include output de-multiplexers that translate internal word width data into non-word width output data.

One particular example of a second mode MUX that can include an output de-multiplexer is set forth in FIG. 16 and designated by the general reference character 1602. FIG. 16 includes the some of the same constituents as FIG. 9, but with the first digits being a "16" instead of a "9."

Unlike the arrangement of FIG. 9, in FIG. 16, data output from a packet output circuit 1612 may be processed by an output de-multiplexer 1614.

As shown in FIG. 16, an output de-multiplexer 1614 may receive mode control signals MODE_WIDTH_OUT. Output de-multiplexer 1614 may convert data characters received in parallel into smaller widths. More particularly, output de-multiplexer 1614 may receive data as eight parallel characters, and output such data characters as a sequence of one, two or four parallel characters, or as eight parallel characters. Such operations can occur according to mode control signals MODE_WIDTH_OUT.

Figure 17:
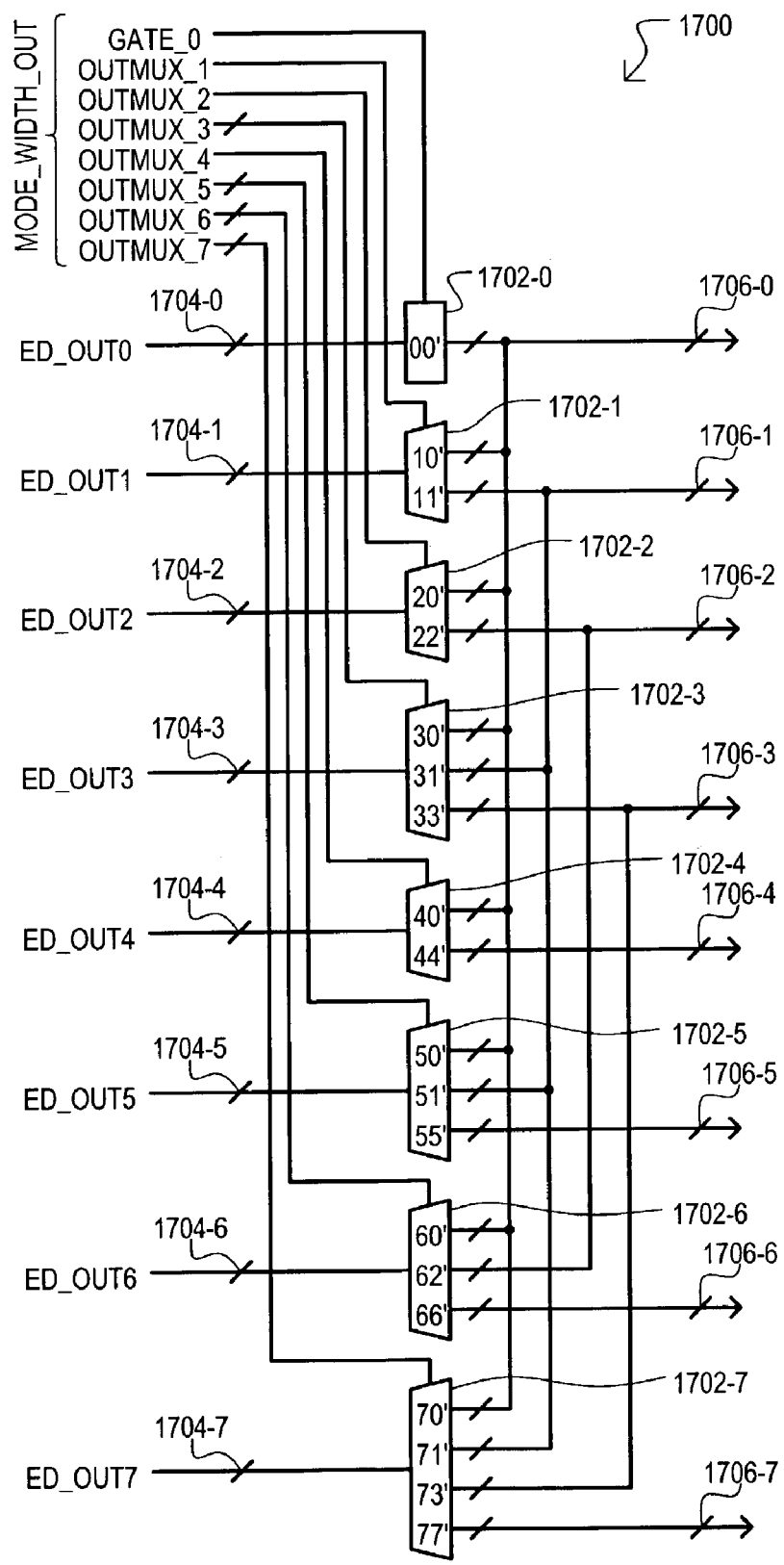
FIG. 17 is a schematic diagram of an output de-multiplexer according to an embodiment.
Figure 19:
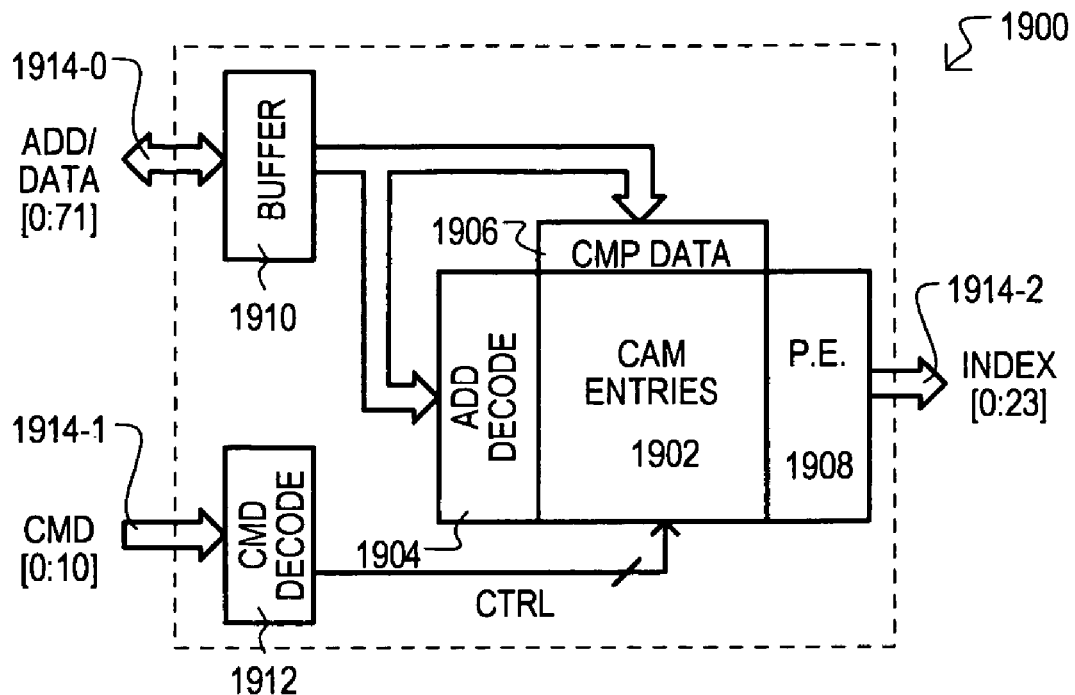
FIG. 19 is a block diagram of a conventional CAM device.
Figure 20:
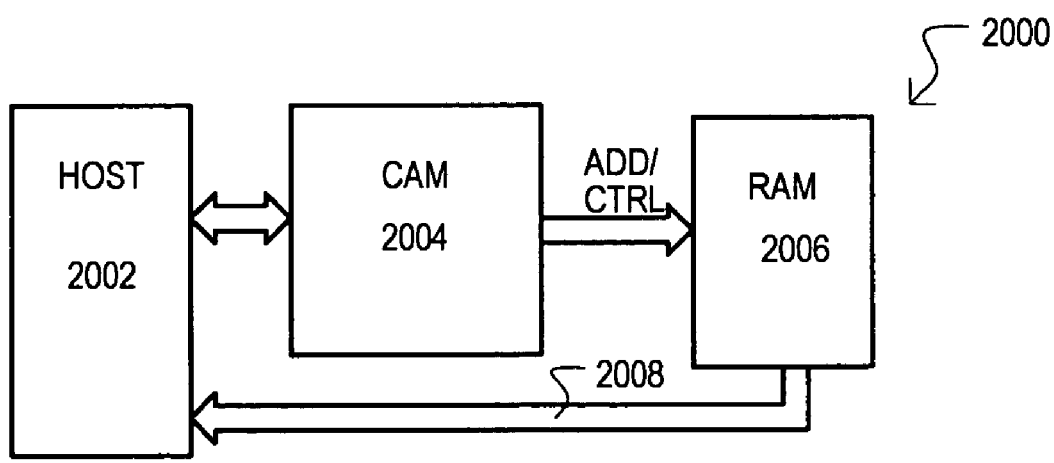
FIG. 20 is a block diagram of a conventional CAM based search engine system.

Referring now to FIG. 17, one example of an output de-multiplexer is set forth in a schematic diagram and designated by the general reference character 1700. An output de-multiplexer 1700 may include a gate circuit 1702-0 and de-MUX circuits 1702-1 to 1702-7, each of which can receive an output encoded data character ED0_OUT to ED7_OUT on input data lanes 1704-0 to 1704-7. According to control signals MODE_WIDTH_IN, gate 1702-0 and de-MUX circuits (1702-1 to 1702-7) can provide received data on selected output data lanes (1706-0 to 1706-7).

Like FIG. 14, the particular example of FIG. 17 illustrates de-multiplexing operations by numbers in each de-MUX circuit or gate (1702-0 to 1702-7) that indicate a selectable logical path between an input data lane (1704-0 to 1704-7) and an output data lane (1706-0 to 1706-7). For example, for de-MUX circuit 1702-7, paths "70'", "71'", and "73'" can be paths between input data lane 1704-7 and output data lanes 1706-0, 1706-1 and 1706-3, respectively.

The operation of the input de-multiplexer of FIG. 17 is shown in FIG. 18. FIG. 18 is a timing diagram that shows which particular paths within gate and/or de-MUX circuits (1702-0 to 1702-7) are enabled according to a particular mode. Modes are represented below the horizontal axis as character widths. Thus, a "x1" mode can correspond to FIG. 12C, "x2" mode can correspond to FIG. 12B, and "x4" mode can correspond to FIG. 12A.

Referring to FIG. 17 in conjunction with FIG. 18, in a "x1" mode, a gate circuit 1702-0 and de-MUX circuits 1702-1 to 1702-7 may sequentially enable paths to output data lane 1706-0, to thereby convert a parallel set of eight data characters into a sequence of single data characters. In a "x2" mode, gate circuit 1702-0 and de-MUX circuit 1702-1 may enable paths to output data lanes 1706-0 and 1706-1, respectively. This may be followed by subsequent pairs of de-MUX circuits (e.g., 1702-2/3, 1702-4/5 and 1702-6/7) sequentially enabling paths to the same two data lanes (1706-0 and 1706-1), to thereby convert a parallel set of eight data characters into a sequence of two parallel data characters. The remaining modes follow from the above description.

In this way, CAM device may accommodate different input data character width formats and/or different output data character formats.

The various embodiments have described a system that may include a CAM device with interfaces for receiving data in packet form and transmitting data in packet form. Thus, unlike conventional CAM devices, data may be input on a number of non-dedicated input lines, and similarly, transmitted on a number of non-dedicated output lines. Such an arrangement may lead to simpler wiring arrangements as point-to-point connections may be situated between devices in a cascade arrangement, thereby eliminating unequal control signal wire lengths that can complicate timing within a system.

It is understood that while the embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A content addressable memory (CAM) device, comprising:
   a de-packetizing section that receives data packets on at least one device input data lane that includes a plurality of conductive lines, the de-packetizing section extracting command data from the received data packets;
   a CAM core for executing search functions in response to command data extracted from the received data packets; and
   a packetizing section that receives result data from the CAM core and outputs such data in a predetermined packet format on at least one device output data lane, that includes a plurality of conductive lines, to a destination external to the CAM device, the packet format including a packet size field that indicates the size of the packet.

2. The CAM device of claim 1, wherein:
   the de-packetizing section includes at least one receiver circuit coupled to the at least one input data lane that amplifies data signals on the data lane to generate at least one character data.

3. The CAM device of claim 1, further including:
   a packetizing section that receives result data from the CAM core and outputs such data in a predetermined packet format on at least one output data lane that includes a plurality of conductive lines.

4. The CAM device of claim 1, wherein:
   the packetizing section includes at least one transmit circuit coupled to the at least one output data lane that drives the conductive lines according to data in the packet format.

5. The CAM system of claim 1, wherein:
   the packetizing section outputs the data in the packet format on a plurality of output data lanes essentially simultaneously.

6. A method, comprising the steps of:
   receiving a request in data packet form at a plurality of content addressable memory (CAM) device inputs;
   extracting command information from the request;
   executing predetermined CAM operations in response to the command information; and
   outputting result data generated in response to the request in data packet form at a plurality of CAM device outputs that are different than the CAM device inputs, the packet form including a code field that indicates the start of the data packet.

7. The method of claim 6, wherein:
   the predetermined CAM operations are selected from the group consisting of search-type operations that can compare a search key value to CAM entry values, write-type operations that can write data values to at least one predetermined location of the CAM device, and read-type operations that can read data values from at least one predetermined location of the CAM device.

8. The method of claim 6, wherein:
   extracting command information includes storing the command information in a memory circuit.

9. The method of claim 6, further including:
   outputting result data generated in response to the request in data packet form at a plurality of CAM device outputs that are different than the CAM device inputs.

10. The CAM system of claim 6, further including:
    outputting the request in data packet form at the plurality of CAM device outputs.

11. A content addressable memory (CAM) system, comprising:
    at least one interface configured to send data packets;
    the sent data packets including response data packets having a status field that stores a status indication for a search in the CAM system and a size field that indicates the size of the data packet; and
    at least one of the sent data packets includes a request data packet having a data field that stores a search key value for comparison with entries in the CAM system.

12. The CAM system of claim 11, wherein:
    at least one of the request data packets includes a target field that stores a destination indication for the packet.

13. The CAM system of claim 12, wherein:
    the target indication is no more than 8 bits.

14. The CAM system of claim 11, wherein:
    the data packets include request data packets received by the CAM system and response packets transmitted from the CAM system.

15. The CAM system of claim 11, wherein:
    the status indication shows a result selected from the group consisting of indicating a match between a search key value and at least one entry in the CAM system, indicating no match between a search key value and entries in the CAM system, indicating multiple matches between a search key value and entries in the CAM system, indicating an entry is free within the CAM system, indicating a block of entries is free within the CAM system, indicating a sub-block of entries is free within the CAM system.

16. The CAM system of claim 11, wherein:
    at least one of the data packets includes a command field that stores a command for execution by at least one device within the CAM system.

17. The CAM system of claim 11, wherein:
    at least one of the data packets includes a priority field that stores a priority value for search in the CAM system.

18. The CAM system of claim 11, wherein:
    at least one of the data packets includes a chip identification (ID) field that stores a chip ID value corresponding to a device within the CAM system.

* * * * *